United States Patent
Soeno et al.

(10) Patent No.: US 7,672,075 B2
(45) Date of Patent: *Mar. 2, 2010

(54) MAGNETIC RECORDING MEDIUM, RECORDING/REPRODUCING APPARATUS, AND STAMPER

(75) Inventors: Yoshikazu Soeno, Tokyo (JP); Kazuya Shimakawa, Tokyo (JP)

(73) Assignee: TDK Corporation, Tokyo (JP)

( * ) Notice: Subject to any disclaimer, the term of this patent is extended or adjusted under 35 U.S.C. 154(b) by 1154 days.

This patent is subject to a terminal disclaimer.

(21) Appl. No.: 11/265,152

(22) Filed: Nov. 3, 2005

(65) Prior Publication Data

US 2006/0203386 A1 Sep. 14, 2006

(30) Foreign Application Priority Data

Mar. 10, 2005 (JP) ............................. 2005-067425

(51) Int. Cl.
*G11B 5/596* (2006.01)
*G11B 5/82* (2006.01)

(52) U.S. Cl. ...................... 360/77.08; 360/48; 360/135; 360/16

(58) Field of Classification Search ............. 360/15–18, 360/48, 77.08, 77.04, 135
See application file for complete search history.

(56) References Cited

U.S. PATENT DOCUMENTS

| | | | |
|---|---|---|---|
| 5,772,905 A | | 6/1998 | Chou |
| 5,907,448 A | | 5/1999 | Watanabe et al. |
| 6,051,299 A | * | 4/2000 | Uchiyama et al. ........ 428/848.5 |
| 6,055,139 A | * | 4/2000 | Ohtsuka et al. ............. 360/131 |
| 6,088,200 A | * | 7/2000 | Morita ........................ 360/135 |
| 6,144,517 A | | 11/2000 | Watanabe et al. |
| 6,347,016 B1 | * | 2/2002 | Ishida et al. ................... 360/17 |
| 6,563,673 B2 | * | 5/2003 | Mundt et al. ................. 360/135 |
| 6,602,620 B1 | * | 8/2003 | Kikitsu et al. ............. 428/842.2 |
| 7,095,581 B2 | * | 8/2006 | Tagami .................... 360/77.08 |
| 7,136,252 B2 | * | 11/2006 | Tagami .................... 360/77.08 |
| 7,193,796 B2 | * | 3/2007 | Yasunaga ..................... 360/17 |

(Continued)

FOREIGN PATENT DOCUMENTS

JP 60-177483 9/1985

(Continued)

OTHER PUBLICATIONS

English language Abstract of JP 2006-048860.

(Continued)

*Primary Examiner*—Dismery E Mercedes
(74) *Attorney, Agent, or Firm*—Greenblum & Bernstein, P.L.C.

(57) ABSTRACT

In a magnetic recording medium including a servo pattern region having a servo pattern formed of a concave/convex pattern having convex portions and concave portions and a data recording region, the region having a data track pattern, the convex portions are formed in an address pattern region of the servo pattern region such that the maximum opening lengths, which are located in the respective same radius regions of the respective opening lengths along the rotating direction of a substrate of the concave portions constituting the concave/convex pattern are set to first lengths that are double the minimum opening lengths along the rotating direction of the concave portions in the respective same radius regions. With this arrangement, the magnetic recording medium can securely read a magnetic signal and has a servo pattern having excellent surface smoothness.

10 Claims, 15 Drawing Sheets

U.S. PATENT DOCUMENTS

| | | | |
|---|---|---|---|
| 7,362,528 B2 * | 4/2008 | Moriya et al. | 360/48 |
| 7,403,355 B2 * | 7/2008 | Soeno et al. | 360/135 |
| 7,443,622 B2 * | 10/2008 | Kaizu et al. | 360/15 |
| 7,474,506 B2 * | 1/2009 | Soeno et al. | 360/135 |
| 2005/0045583 A1 * | 3/2005 | Fujita et al. | 216/44 |

FOREIGN PATENT DOCUMENTS

| | | |
|---|---|---|
| JP | 63-275001 | 11/1988 |
| JP | 7-226044 | 8/1995 |
| JP | 9-204649 | 8/1997 |
| JP | 10-255407 | 9/1998 |
| JP | 11-161944 | 6/1999 |
| JP | 2000-195042 | 7/2000 |
| JP | 2002-359138 | 12/2002 |
| JP | 2003-016623 | 1/2003 |
| JP | 2003-123202 | 4/2003 |
| JP | 2003-203332 | 7/2003 |
| JP | 2003-300796 | 10/2003 |
| JP | 2004-071587 | 3/2004 |
| JP | 6-236630 | 8/2004 |
| JP | 2004-295991 | 10/2004 |
| JP | 2005-004917 | 1/2005 |
| JP | 2005-056535 | 3/2005 |
| JP | 2006-048860 | 2/2006 |
| WO | 98/38549 | 9/1998 |

OTHER PUBLICATIONS

English language Abstract of JP 2005-004917.
Tanaka, "Introduction to Recording Encoding Technology," Nikkei BP, 1997, pp. 169-194 (in Japanese), together with an English language translation of portions as indicated in this document.
English language Abstract of JP 6-236630.
English language Abstract of JP 60-177483.
English language Abstract of JP 7-226044.
English language Abstract of JP 10-255407.
English language Abstract of JP 2005-056535.
English language Abstract of JP 2003-123202.
English language Abstract of JP 2002-359138.
Tanaka, "Introduction to Recording Encoding Technology," Nikkei BP, 1997, pp. 169-194 (in Japanese), together with an English language translation of portions as indicated in this document.
English language Abstract of JP 9-204649.
English language Abstract of JP 63-275001.
English language Abstract of JP 2000-195042.
English language Abstract of JP 2003-203332.
English language Abstract of JP 2003-016623.
English language Abstract of JP 2004-295991.
English language Abstract of JP2004-071587.
English language Abstract of JP 11-161944.
English language Abstract of JP 2003-300796.
English Language Abstract of JP 6-195907.
English Language Abstract of JP 6-259709.
English Language Abstract of JP 2002-015418.
U.S. Appl. No. 11/214,813 to Soeno et al., filed Aug. 31, 2005.
U.S. Appl. No. 11/214,827 to Soeno et al., filed Aug. 31, 2005.
U.S. Appl. No. 11/229,650 to Soeno et al., filed Sep. 20, 2005.
U.S. Appl. No. 11/265,260 to Soeno et al., filed Nov. 3, 2005.

* cited by examiner

F I G. 3 0
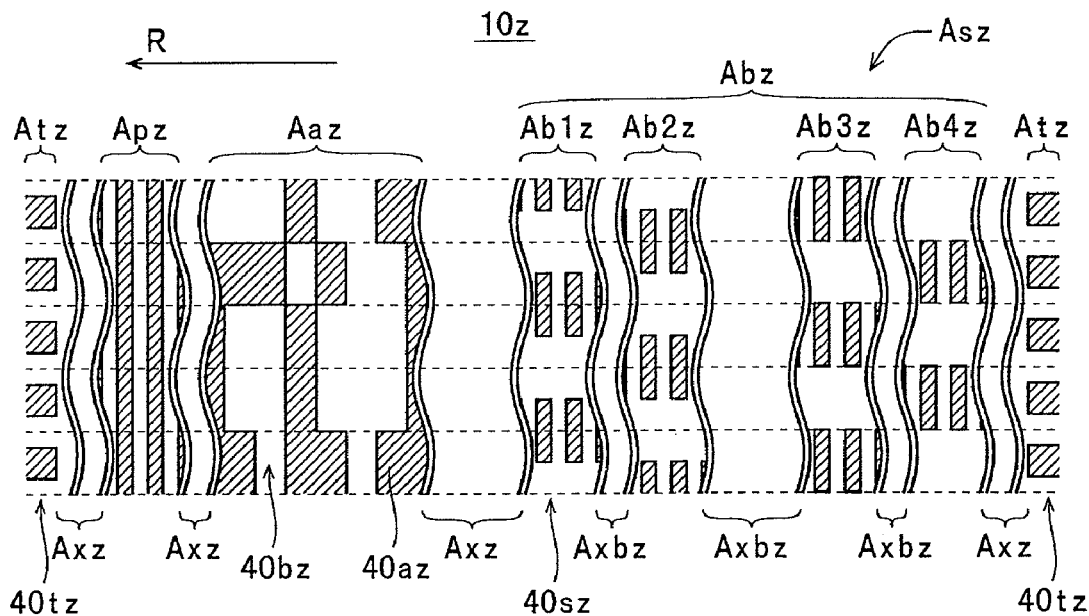
F I G. 3 1   PRIOR ART
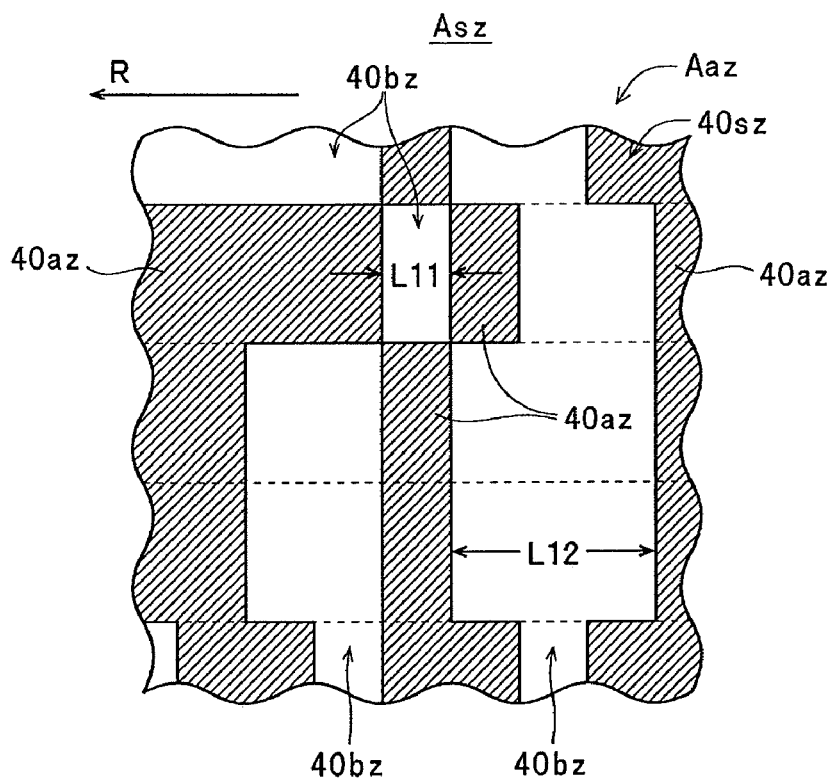

F I G. 3 2 PRIOR ART
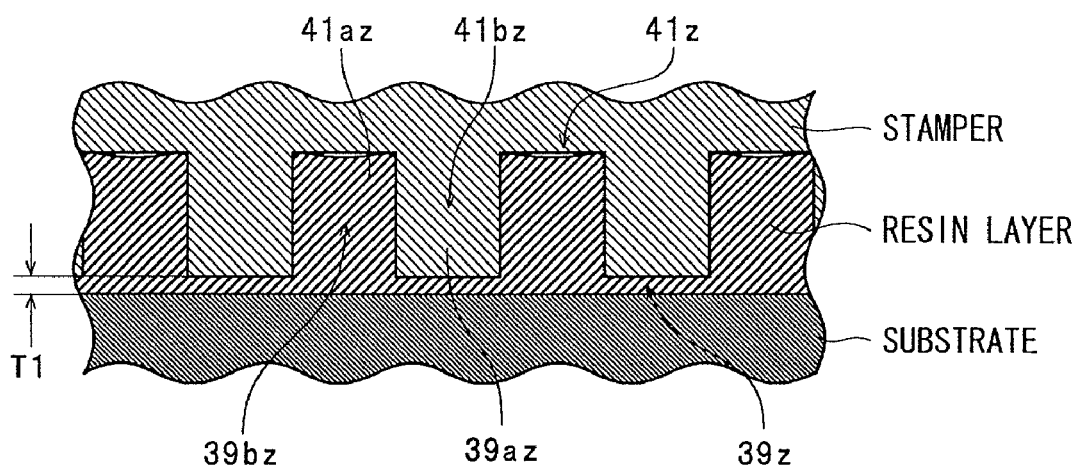
F I G. 3 3 PRIOR ART
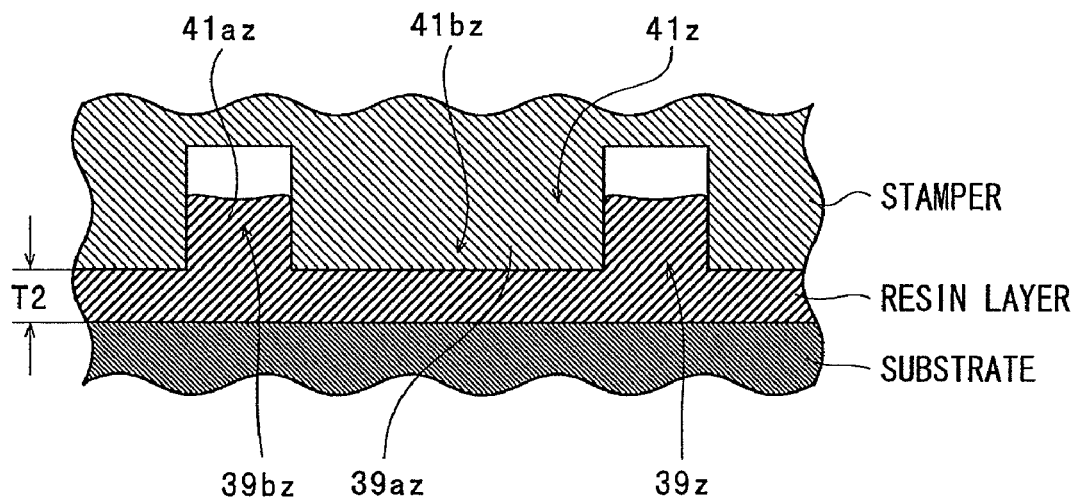

MAGNETIC RECORDING MEDIUM, RECORDING/REPRODUCING APPARATUS, AND STAMPER

BACKGROUND OF THE INVENTION

1. Field of the Invention

The present invention relates to a magnetic recording medium having a servo pattern formed of a concave/convex pattern in a servo pattern region, to a recording/reproducing apparatus having the magnetic recording medium, and to a stamper for manufacturing the magnetic recording medium.

2. Description of the Related Art

U.S. Pat. No. 5,772,905 discloses nanoimprint lithography (an imprint method of forming a concave/convex pattern of nanometer size: hereinafter, also called "imprint method"). According to the nanoimprint lithography, in a process of manufacturing semiconductor devices, information recording mediums, and the like, a concave/convex pattern of nanometer size is formed on a substrate by transferring a concave/convex shape of a stamper onto the substrate by pressing the stamper on which a concave/convex pattern of nanometer size is formed. In the imprint method described above, first, a stamper (mold) having a concave/convex pattern of nanometer size (as an example, a minimum width of about 25 nm) on a transfer surface is manufactured. Specifically, a resin layer is formed to cover a thin film (molding layer) of silicon oxide and the like formed on the silicon substrate, and a desired pattern is drawn on the resin layer using an electron beam lithography apparatus. Subsequently, the thin film is etched by a reactive ion etching apparatus using the resin layer as a mask, and a concave/convex pattern having a plurality of convex portions (features) is formed in the thickness of the thin film, thereby the stamper is manufactured.

Next, a resin layer (thin film layer) having a thickness of 55 nm is formed by spin coating polymethyl methacrylate (PMMA: resin material) on a surface of, for example, a silicon substrate. Subsequently, after both a laminated body, which is composed of the substrate and the resin layer, and the stamper are heated, the respective concave portions of the stamper are pressed against the resin layer on the substrate. At the time, since the resin material in the portions into which the convex portions of the stamper are forcibly inserted moves to the concave portions of the stamper, concave portions (regions) are formed (transferred) to the portions in which the convex portions are forcibly inserted. Next, after the laminated body against which the stamper is pressed is left as it is until the temperature thereof is lowered to a room temperature, the stamper is exfoliated from the resin layer. With this operation, the respective convex portions of the concave/convex pattern of the stamper are transferred onto the resin layer and a concave/convex pattern of nanometer size is formed on the substrate (resin layer). Subsequently, a substrate is etched using the resin layer on which the concave/convex pattern is formed as a mask, thereby a plurality of concave portions are formed on the substrate. Accordingly, when concave portions are formed on a resin layer of a substrate for an information recording medium by the above technology (imprint method), an information recording medium having a concave/convex pattern of nanometer size can be manufactured executing etching processing using the resin layer as a mask.

SUMMARY OF THE INVENTION

The inventors have found the following problems as a result of examination of an information recording medium (magnetic recording medium) manufactured by the imprint method (manufacturing method). That is, in the manufacturing method described above, the convex portions of the stamper are forcibly inserted into the resin layer formed on the substrate and the concave/convex pattern is formed on the substrate by forming the concave portions on the resin layer, and the substrate is etched using the resin layer on which the concave/convex pattern is formed as the mask to thereby form the concave/convex pattern on the substrate. When, however, a discrete track type magnetic recording medium is manufactured by the manufacturing method, since the convex portions (convex portions of the stamper) are forcibly inserted into the resin layer in an insufficient amount, a large amount of the resin material remains in the bottoms of the concave portions of the concave/convex pattern formed on (transferred onto) the resin layer. Since the concave portions excessively expand when the remaining resin material is eliminated, it may be difficult to highly accurately form the concave/convex pattern on the magnetic recording medium.

Specifically, as shown in, for example, FIG. 29, in a magnetic disk $10z$ manufactured by the above manufacturing method, data recording regions Atz and servo pattern regions Asz are disposed alternately in the rotating direction of the magnetic disk $10z$ (in the direction of an arrow R shown in FIG. 29), a data track pattern $40tz$ formed of a plurality of concentric data recording tracks is formed in each of the data recording regions Atz, and a tracking servo pattern $40sz$ is formed in each of servo pattern regions Asz. Further, as shown in FIG. 30, the servo pattern regions Asz of the magnetic disk $10z$ include, as an example, preamble pattern regions Apz having a preamble pattern formed therein, address pattern regions Aaz having an address pattern formed therein, and burst pattern regions Abz including burst regions $Ab1z$ to $Ab4z$ each having a burst pattern formed therein. It should be noted that, in the figure and in FIG. 31 that will be referred to later, the regions with slanting lines show the regions in which convex portions $40az$ are formed in the servo pattern $40sz$ and the data track pattern $40tz$.

In this case, in conventional magnetic disks including the magnetic disk $10z$, the opening lengths of the convex portions $40az$ of the servo pattern $40sz$ formed in the address pattern regions Aaz may be made very long along the rotating direction of the substrate in correspondence to the contents of address data to be recorded. It should be noted that, "opening lengths of the concave portions" in the specification means a distance between the confronting edges of both the projecting end surfaces of convex portions disposed adjacent to each other across a concave portion. Specifically, when address data is recorded to the address pattern regions Aaz, if, for example, concave portions $40bz$ are formed in correspondence to "1" and convex portions $40az$ are formed in correspondence to "0", the opening lengths of the concave portions $40bz$ along the rotating direction are made long in the portion in which a large number of "1"s continuously exist on the address data. As a result, as shown in, for example, FIG. 31, in the portion of the address data in which "1"s do not exist continuously (portion in which the address data is composed of "0, 1, 0"), the opening lengths L11 along the rotating direction of the concave portions $40bz$, which are formed in correspondence to "1"s, are made relatively short. In contrast, in the portion of the address data in which a plurality of "1"s exist continuously (for example, a portion in which the address data is composed of "0, 1, 1, 1, 0", and the like), the opening lengths L12 along the rotating direction of the concave portions 40bz, which are formed in correspondence to "1"s, are made long. In this case, as shown in FIGS. 30 and 31, in the address pattern regions Aaz, since the concave portions 40bz are continuously formed in a radius direction so as to cross a plurality of recording tracks (in the up/down direction in both the drawings) in many cases, the opening lengths of concave portions 40bz tend to be made long along a radius direction. Accordingly, in the portion of the address data in which a plurality of "1"s exist continuously, both the opening lengths of the concave portions 40bz are made long along the radius direction and the rotating direction (opening surfaces are made excessively wide). It should be noted that "opening surfaces of concave portions" in the specification mean a region between the confronting edges of both the projecting end surfaces of convex portions disposed adjacent to each other across a concave portion, that is, the region of the concave/convex pattern from which the projecting end surfaces of convex portions are excluded.

Further, as shown in FIG. 30, in the conventional magnetic disk 10z, non-servo signal regions Axz are formed in the respective regions between the data recording regions Atz and the preamble pattern regions Apz, between the preamble pattern regions Apz and the address pattern regions Aaz, between the address pattern regions Aaz and the burst pattern regions Abz, and the burst pattern regions Abz and the data recording regions Atz. Further, non-servo signal regions Axbz composed of convex portions are formed between the respective regions from the burst regions Ab1z to the burst regions Ab4z in the burst pattern regions Abz. No tracking servo control signal is recorded in the non-servo signal regions Axz, Axbz, and almost all the areas of the non-servo signal regions Axz, Axbz are composed of concave portions and no convex portion exists therein. Accordingly, in the non-servo signal regions Axz, Axbz, both the opening lengths along a radius direction and the opening lengths along the rotating direction of the concave portions 40bz are made very long (the opening surfaces thereof are made excessively wide).

In this case, in the data recording regions Atz and the servo pattern regions Asz, various types of concave portions are formed such as concave portions having narrow opening surfaces (for example, concave portions in which any one of the opening lengths of them along the rotating direction of the magnetic disk 10z and the opening lengths of them along a radius direction thereof is short) and, concave portions having wide opening surfaces (for example, concave portions in which both of the opening lengths of them along the rotating direction of the magnetic disk 10z and the opening lengths of them along a radius direction thereof are long). Further, a stamper for manufacturing the magnetic disk 10z has a concave/convex pattern 39z formed thereon (refer to FIGS. 32 and 33), the concave/convex pattern 39z having a concave/convex positional relation inverted to that of a concave/convex pattern to be formed on the magnetic disk 10z. Accordingly, as shown in FIGS. 32 and 33, formed on the stamper for manufacturing the magnetic disk 10z are various types of convex portions 39az such as convex portions having narrow projecting end surfaces (convex portions 39az shown in FIG. 32), convex portions having wide projecting end surfaces (convex portions 39az shown in FIG. 33), and the like. In this case, in the conventional manufacturing method, the concave/convex pattern 39z is pressed against a resin layer over the entire area of the stamper with approximately the same press force. At the time, as shown in FIG. 32, in the portion in which the convex portions 39az whose projecting end surfaces are relatively narrow are formed (for example, a portion corresponding to an address pattern in a portion in which "1"s do not exist continuously in address data), a resin material in the portion, into which the convex portions 39az are forcibly inserted, smoothly move into the concave portions 39bz of the stamper, thereby the convex portions 39az can be forcibly inserted into the resin layer sufficiently deeply. As a result, a concave/convex pattern 41z, in which the resin layer has a sufficiently thin thickness T1 between the extreme ends of the convex portions 39az and the substrate (on the bottoms of concave portions 41bz), can be formed on the substrate. It should be noted that, in the following description, the resin material remaining between the bottom surfaces of the concave portions formed on the resin layer and the substrate is also called a "residual".

In contrast, as shown in FIG. 33, in the portion in which the convex portions 39az whose projecting end surfaces are relatively wide are formed (for example, a portion corresponding to an address pattern in a portion in which "1"s exist continuously and a portion corresponding to the non-servo signal regions Axz, Axbz), it is difficult for the resin material in the portion, into which the convex portions 39az are forcibly inserted, to move into the concave portions 39bz of the stamper. Accordingly, it is difficult to forcibly insert the convex portions 39az into the resin layer sufficiently deeply. As a result, a residual having a thickness T2 is formed between the extreme ends of the convex portions 39az and the substrate (on the bottoms of the concave portions 41bz), thereby the depth of the concave portions 41bz is made shallow. In this case, when a substrate is etched using the resin layer, on which the concave/convex pattern 41z is formed, as a mask, the residual remaining on the bottoms of the concave portions 41bz of the concave/convex pattern 41z must be eliminated by etching processing and the like (elimination processing described above). Further, as described above, the thickness T1 of the residual in the portion into which the convex portions 39az whose projecting end surfaces are narrow are forcibly inserted is sufficiently thinner than the thickness T2 of the residual in the portion into which the convex portions 39az whose projecting end surfaces are wide are forcibly inserted. Accordingly, when etching processing (elimination processing) is executed for a sufficiently long time so that the residual having the thickness T1 can be securely eliminated, the elimination of the residual having the thickness T1 is completed prior to the completion of elimination of the residual having the thickness T1. As a result, in the portion from which the residual having the thickness T1 is eliminated (the portion of the concave portions 41bz having narrow bottom surfaces), the inner walls (convex portions 41az) of the concave portions 41bz are eroded by a gas continuously irradiated until the residual having the thickness T2 is completely eliminated. Therefore, in the magnetic disk 10z manufactured by the conventional manufacturing method, it is difficult to form the concave portions 41bz having an extent desired when it is manufactured. As a result, the concave portions formed in the data recording regions Atz and the servo pattern regions Asz are made excessively wide, from which it may be difficult to securely read a magnetic signal.

A main object of the present invention, which was made in view of the above problems, is to provide a magnetic recording medium, which has a servo pattern capable of securely reading a magnetic signal, and a recording/reproducing apparatus as well as a stamper which can manufacture the magnetic recording medium.

To achieve the above object, a magnetic recording medium according to the present invention includes a servo pattern region formed on at least one surface side of a substrate, the servo pattern region having a servo pattern formed of a concave/convex pattern having a plurality of convex portions and concave portions, at least projecting end portions of the convex portions are formed of a magnetic material, and a data recording region formed on the one surface side of the substrate, the data recording region having a data track pattern on which a concentric or spiral data recording track is formed, wherein the convex portions are formed in an address pattern region of the servo pattern region such that maximum opening lengths, which are located in the respective same radius regions each having the same distance from the center of the data track pattern, of the respective opening lengths along the rotating direction of the substrate of the concave portions constituting the concave/convex pattern for an address pattern are set to first lengths that are double minimum opening lengths along the rotating direction of the respective concave portions in the respective same radius regions. In this case, "double lengths" means approximately double lengths, and even if a very slight degree of a manufacturing error occurs when convex portions are formed in order to form concave portions whose target lengths are double the minimum opening lengths, it is assumed that the opening lengths of the concave portions, which are different from the above double lengths by a length due to the manufacturing error, are also the lengths that are double the minimum opening lengths (first lengths). Further, even if convex portions are formed in order to form concave portions by defining a slight amount of a tolerance to the "double lengths" different from the manufacturing error from the beginning, it is assumed that the opening lengths of the concave portions are also the lengths that are double the minimum opening lengths (first lengths).

In the magnetic recording medium, the convex portions are formed in the address pattern region such that the maximum opening lengths in the respective same radius regions of the respective opening lengths along the rotating direction of the concave portions constituting the concave/convex pattern are set to the first lengths that are double the minimum opening lengths along the rotating direction of the concave portions in the respective same radius regions. Accordingly, there exist no concave portions whose opening lengths are excessively long along the rotating direction (concave portions whose opening lengths are long in all the directions) in the address pattern region in which the opening lengths along a radius direction of the concave portions tend to increase. Thus, when imprint processing is executed to form the concave/convex pattern in the address pattern region (for example, when the concave/convex pattern of a stamper is transferred onto a resin layer of an intermediate body for manufacturing the magnetic recording medium), the convex portions of the stamper can be forcibly inserted into the resin layer smoothly without using a stamper having convex portions whose projecting end surfaces are excessively wide. With this arrangement, since a thick residual is prevented from being formed on the intermediate body in the imprint processing, the concave portions formed on the resin layer can be prevented from being made excessively wide by residual elimination processing. Accordingly, the respective concave portions formed on the magnetic recording medium can be prevented from being made wide. As a result, the magnetic recording medium, which can accurately read the address data, and the recording/reproducing apparatus including the magnetic recording medium can be provided.

According to a magnetic recording medium of the present invention, the convex portions constituting the concave/convex pattern are formed in the servo pattern region such that when a circular region whose diameter is equal to the maximum length of the respective first lengths is disposed in any portions of the servo pattern region, at least a part of the convex portions is included in the circular region in the magnetic recording medium. It should be noted that the state in the specification that "at least a part of the convex portions is included in the circular region" means the state that "the boundary portions between the convex portions and the concave portions constituting the concave/convex pattern (the ends of the convex portions) are included in the circular region". With this arrangement, there are no concave portions whose opening lengths are excessively long (whose opening surfaces are excessively wide) in all the areas of not only the address pattern region but also the servo pattern region. As a result, when the imprint processing is executed to form the concave/convex pattern in the servo pattern region, the convex portions of the stamper can be forcibly inserted into the resin layer of the intermediate body for manufacturing the magnetic recording medium smoothly without using a stamper having convex portions whose projecting end surfaces are excessively wide. Thus, a thick residual can be prevented from being formed on the intermediate body in the imprint processing, thereby the respective concave portions formed on the resin layer can be prevented from being made excessively wide by residual elimination processing. Accordingly, the respective concave portions formed on the magnetic recording medium can be prevented from being made wide. As a result, the magnetic recording medium, which can securely read the tacking servo control data, and the recording/reproducing apparatus including the magnetic recording medium can be provided.

According to a magnetic recording medium of the present invention, a plurality of the data recording tracks are formed of convex portions at least projecting end portions of which are formed of the magnetic material, and the respective data recording tracks are formed such that the opening lengths along a radius direction of the substrate of the concave portions between the adjacent data recording tracks are set equal to or less than the maximum length of the first lengths in any of the magnetic recording mediums described above. With this arrangement, there exist no concave portions whose opening lengths along a radius direction are excessively long (concave portions whose opening lengths are long in all the directions) in the data recording region in which the opening lengths along the rotating direction of the concave portions (inter-track concave portions) increase. As a result, when the imprint processing is executed to form the concave/convex pattern in the data recording region, the convex portions of the stamper can be forcibly inserted into the resin layer of the intermediate body for manufacturing the magnetic recording medium smoothly without using a stamper having convex portions whose projecting end surfaces are excessively wide. With this arrangement, since a thick residual is prevented from being formed in the imprint processing, the concave portions formed on the resin layer can be prevented from being made excessively wide by residual elimination processing. Thus, the respective concave portions formed on the magnetic recording medium can be prevented from being made wide. As a result, the magnetic recording medium, which can stably record and reproduce data, and the recording/reproducing apparatus including the magnetic recording medium can be provided.

The magnetic recording medium according to the present invention includes a servo pattern region formed on at least one surface side of a substrate, the servo pattern region having a servo pattern formed of a concave/convex pattern having a plurality of convex portions and concave portions, at least projecting end portions of the convex portions are formed of a magnetic material, and a data recording region formed on the one surface side of the substrate, the data recording region having a data track pattern on which a concentric or spiral data recording track is formed, wherein the convex portions are formed in an address pattern region of the servo pattern region such that the respective opening lengths along the rotating direction of the substrate of the concave portions constituting the concave/convex pattern for an address pattern are set to A lengths (second lengths) that are equal to each other in the respective same radius regions each having the same distance from the center of the data track pattern. In this case, "equal to each other" means approximately equal to each other, and even if a very slight degree of a manufacturing error occurs when convex portions are formed in order to form concave portions whose target lengths are equal to the second lengths, it is assumed that the opening lengths of the concave portions, which are different by a length due to the manufacturing error, are also the second lengths that are equal to each other. Further, even if convex portions are formed in order to form concave portions by defining a slight amount of a tolerance different from the manufacturing error from the beginning, it is assumed that the opening lengths of the concave portions are also the second lengths that are equal to each other.

In the magnetic recording medium, the convex portions are formed in the address pattern region such that the respective opening lengths along the rotating direction of the convex portions constituting the concave/convex pattern are set to the second lengths that are equal to each other in the respective same radius regions. Accordingly, there exist no concave portions whose opening lengths are excessively long along the rotating direction (concave portions whose opening lengths are long in all the directions) in the address pattern region in which the opening lengths along a radius direction of the concave portions tend to increase. Thus, when imprint processing is executed to form the concave/convex pattern in the address pattern region (for example, when the concave/convex pattern of a stamper is transferred onto a resin layer of an intermediate body for manufacturing the magnetic recording medium), the convex portions of the stamper can be forcibly inserted into the resin layer smoothly without using a stamper having convex portions whose projecting end surfaces are excessively wide. With this arrangement, since a thick residual is prevented from being formed on the intermediate body in the imprint processing, the concave portions formed on the resin layer can be prevented from being made excessively wide by residual elimination processing. Thus, the respective concave portions formed on the magnetic recording medium can be prevented from being made wide. As a result, the magnetic recording medium, which can accurately read the address data, and the recording/reproducing apparatus including the magnetic recording medium can be provided.

According to a magnetic recording medium of the present invention, the convex portions constituting the concave/convex pattern are formed in the servo pattern region such that when a circular region whose diameter is equal to the maximum length of the respective A lengths (second lengths) is disposed in any portions in the servo pattern region, at least a part of the convex portions is included in the circular region in the magnetic recording medium. With this arrangement, there are no concave portions whose opening lengths are excessively long (whose opening surfaces are excessively wide) in all the areas of not only the address pattern region but also the servo pattern region. As a result, when the imprint processing is executed to form the concave/convex pattern in the servo pattern region, the convex portions of the stamper can be forcibly inserted into the resin layer of the intermediate body for manufacturing the magnetic recording medium smoothly without using a stamper having convex portions whose projecting end surfaces are excessively wide. Thus, a thick residual can be prevented from being formed on the intermediate body in the imprint processing, thereby the respective concave portions formed on the resin layer can be prevented from being made excessively wide by the residual elimination processing. Since the concave portions formed on the resin layer can be prevented from being made excessively wide by residual elimination processing, the concave portions formed on the magnetic recording medium can be prevented from being made excessively wide. As a result, the magnetic recording medium, which can securely read the tacking servo control data, and the recording/reproducing apparatus including the magnetic recording medium can be provided.

According to a magnetic recording medium of the present invention, a plurality of the data recording tracks are formed of convex portions at least the projecting end portions of which are formed of the magnetic material, and the respective data recording tracks are formed such that the opening lengths along a radius direction of the substrate of the concave portions between the adjacent data recording tracks are set equal to or less than the maximum length of the A lengths (second lengths) lengths in any of the magnetic recording mediums described above. With this arrangement, there exist no concave portions whose opening lengths along a radius direction are excessively long (concave portions whose opening lengths are long in all the directions) in the data recording regions in which the opening lengths along the rotating direction of the concave portions (inter-track concave portions) increase. As a result, when the imprint processing is executed to form the concave/convex pattern in the data recording region, the convex portions of the stamper can be forcibly inserted into the resin layer of the intermediate body for manufacturing the magnetic recording medium smoothly without using a stamper having convex portions whose projecting end surfaces are excessively wide. Thus, a thick residual can be prevented from being formed on the intermediate body in the imprint processing, thereby the respective concave portions formed on the resin layer can be prevented from being made excessively wide by the residual elimination processing. Thus, the respective concave portions formed on the magnetic recording medium can be prevented from being made wide. As a result, the magnetic recording medium, which can stably record and reproduce data, and the recording/reproducing apparatus including the magnetic recording medium can be provided.

A recording/reproducing apparatus according to the present invention includes any of the magnetic recording mediums and a control section for executing tracking servo control processing based on a predetermined signal read from the servo pattern region in the magnetic recording medium.

The recording/reproducing apparatus includes any of the magnetic recording mediums and the control section for executing the tracking servo control processing based on the predetermined signal read from the servo pattern region of the magnetic recording medium. Accordingly, data can be recorded and reproduced through a magnetic head placed on convex portions (data recording tracks) in data recording regions without being affected by the existence of the concave/convex pattern (dummy pattern) formed in, for example, the non-servo signal regions.

Further, a stamper according to the present invention is a stamper for manufacturing the magnetic recording medium and includes a concave/convex pattern formed thereon, the concave/convex pattern having convex portions formed in correspondence to the concave portions of the concave/convex pattern in any of the magnetic recording mediums and concave portions formed in correspondence to the convex portions of the concave/convex pattern in any of the magnetic recording mediums.

Formed on the stamper are the concave/convex pattern which has the convex portions formed in correspondence to the concave portions and the concave portions formed in correspondence to the convex portions of the concave/convex pattern in any of the magnetic recording mediums. Thus, when the intermediate body for manufacturing the magnetic recording medium is subjected to the imprint processing, there exist no convex portions having excessively wide projecting end surfaces (for example, convex portions whose direction along the rotating direction and whose direction along a radius direction are excessively long) on the stamper, thereby the convex portions of the stamper can be forcibly inserted into the intermediate body smoothly. Accordingly, the occurrence of disadvantage due to an insufficient amount of forcible insertion of the convex portions can be prevented in the imprint processing (excessive expansion of the concave portions formed on the magnetic recording medium due to residual elimination processing). Accordingly, the magnetic recording medium, which can securely read the address data and the like, can be manufactured.

It should be noted that disclosure of the present invention relates to the subject contained in Japanese Patent Application No. 2005-67425 filed on Mar. 10, 2005, which is hereby explicitly incorporated as reference.

BRIEF DESCRIPTION OF THE DRAWINGS

These and other objects and features of the present invention will be explained in more detail below with reference to the attached drawings, wherein:

FIG. 30 is a plan view of the conventional magnetic disk showing an example of various types of patterns formed in a data recording region and a servo pattern region;

FIG. 31 is a plan view of the conventional magnetic disk showing an example of an address pattern formed in an address pattern region;

FIG. 32 is a cross-sectional view of a resin layer into which convex portions (convex portions having narrow projecting end surfaces) of a stamper are forcibly inserted in a process of manufacturing the conventional magnetic disk; and FIG. 33 is a cross-sectional view of a resin layer into which convex portions (convex portions having wide projecting end surfaces) of the stamper are forcibly inserted in the process of manufacturing the conventional magnetic disk.

DESCRIPTION OF THE PREFERRED EMBODIMENTS

A best mode of a magnetic recording medium, a recording/reproducing apparatus, and a stamper according to the present invention will be explained below with reference to the accompanying drawings.

Figure 1:
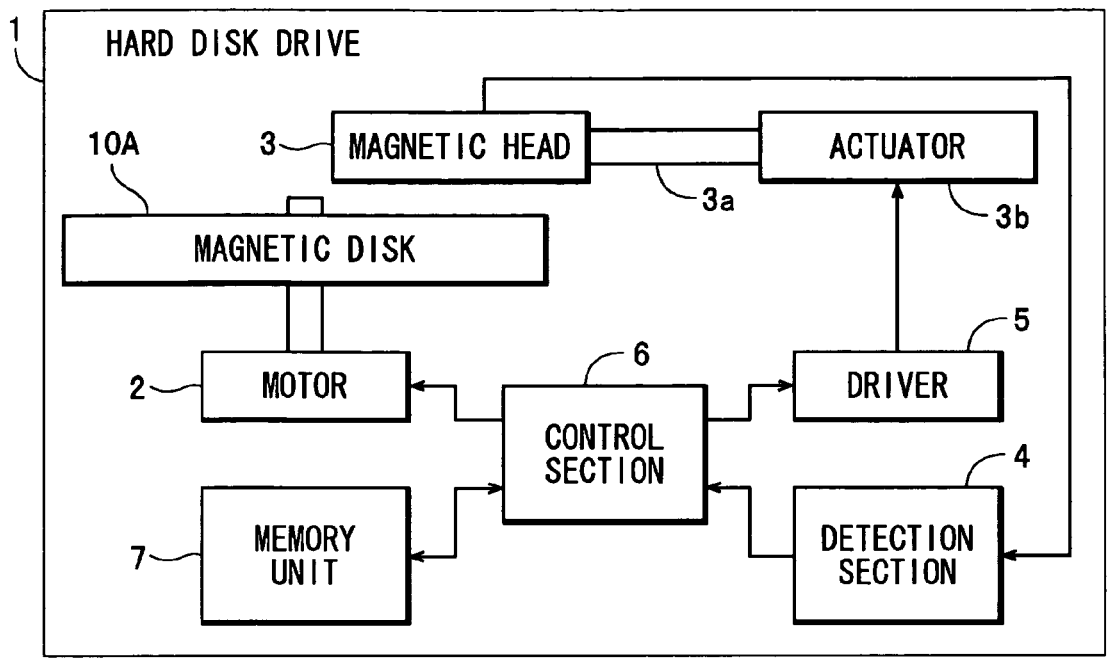
FIG. 1 is a constitutional view of a hard disk drive.

A hard disk drive 1 shown in FIG. 1 is an example of the recording/reproducing apparatus which includes a motor 2, a magnetic head 3, a detection section 4, a driver 5, a control section 6, a memory unit 7, and a magnetic disk 10A and can record and reproduce various types of data. The motor 2 rotates the magnetic disk 10A at, for example, a constant speed of 4200 rpm under the control of the control section 6. The magnetic head 3 is attached to an actuator 3b through a swing arm 3a and moved on the magnetic disk 10A by the actuator 3b when data is recorded to and reproduced from the magnetic disk 10A. Further, the magnetic head 3 reads out servo data from servo pattern regions Asa (refer to FIG. 2) of the magnetic disk 10A, magnetically writes recording data to data recording regions At (refer to FIG. 2), and reads out recording data magnetically written to the data recording regions At. It should be noted that although the magnetic head 3 is actually formed on the bottom surface (air bearing surface) of a slider for flying the magnetic head 3 with respect to the magnetic disk 10A, the explanation and the illustration of the slider are omitted. The actuator 3b moves the magnetic head 3 to an arbitrary recording/reproducing position on the magnetic disk 10A by swinging the swing arm 3a by a drive current supplied from the driver 5 under the control of the control section 6.

The detection section 4 obtains (detects) servo data from an output signal (analog signal) output from the magnetic head 3 and outputs it to the control section 6. The driver 5 places the magnetic head 3 on a desired data recording track by controlling the actuator 3b according to a control signal output from the control section 6. The control section 6 integrally controls the hard disk drive 1. Further, the control section 6 is an example of a control section according to the present invention and controls the driver 5 based on servo data (an example of a "predetermined signal read from the servo pattern regions) output from the detection section 4 (executes tracking servo control processing). The memory unit 7 stores the operation program and the like of the control section 6.

Figure 4:
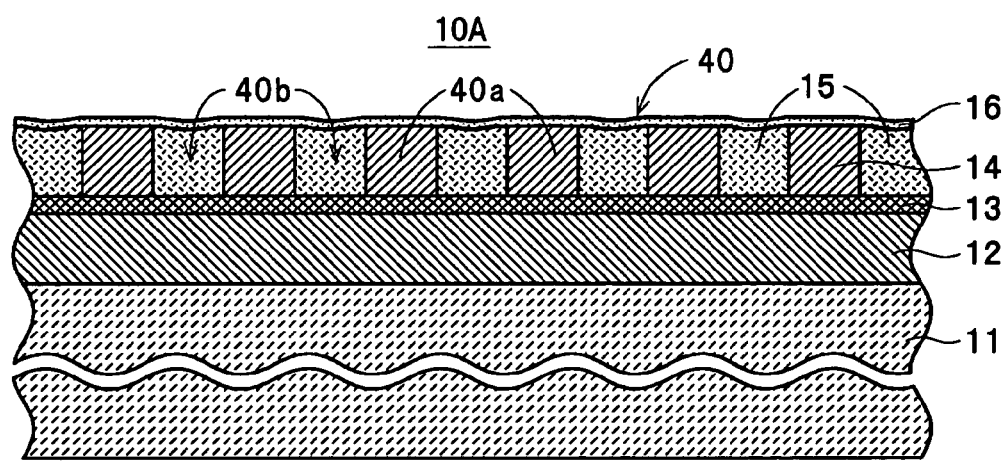
FIG. 4 is a cross-sectional view showing a layer structure of the magnetic disk.

In contrast, the magnetic disk 10A is an example of a magnetic recording medium according to the present invention and disposed in a cabinet of the hard disk drive 1 together with the motor 2, the magnetic head 3, and the like described above. The magnetic disk 10A is a discrete track type magnetic disk (patterned medium) that can record recording data by a perpendicular recording system and composed of a soft magnetic layer 12, an intermediate layer 13, and magnetic layers 14 formed on a glass substrate 11 in this order as shown in FIG. 4. In this case, the magnetic layers 14 constitute a concave/convex pattern 40 in which convex portions 40a and concave portions 40b, which are interposed between the convex portions 40a, are formed, and the convex portions 40a are formed of a magnetic material in its entirety from the projecting ends (upper ends in FIG. 4) to base ends (lower ends in FIG. 4). Further, a non-magnetic material 15 such as $SiO_2$ or the like is filled in the concave portions 40b, thereby the surface of the magnetic disk 10A is flattened. Further, a protection layer 16 (DLC film) having a thickness of about 2 nm is formed on the surface of the non-magnetic material 15 filled in the concave portions 40b and on the magnetic layers 14 (convex portions 40a). Further, a lubricant (as an example, fomblin lubricant) is coated on the surface of the protection layer 16 to avoid the damage to both the magnetic head 3 and the magnetic disk 10A.

The glass substrate 11 corresponds to a substrate in the present invention and is formed to a circular disk shape having a thickness of about 0.6 mm by polishing the front surface of a glass sheet. It should be noted that the substrate in the present invention is not limited to the glass substrate, and substrates that are composed of various types of non-magnetic materials such as aluminum, ceramics, and the like and formed in a circular shape may be used. The soft magnetic layer 12 is formed in a thin film shape having a thickness of about 100 nm to 200 nm by sputtering a soft magnetic material such as CoZrNb alloy and the like. The intermediate layer 13 is a layer acting as a base layer for forming the magnetic layers 14 and formed in a thin film shape having a thickness of about 40 nm by sputtering an intermediate layer forming material such as Cr, CoCr non-magnetic alloy, and the like. The magnetic layers 14 are layers for constituting a concave/convex pattern 40 (a data track pattern 40t and a servo pattern 40sa shown in FIG. 3), and concave portions 40b are formed by etching a layer formed by sputtering, for example, CoCrPt alloy as described later.

Figure 2:
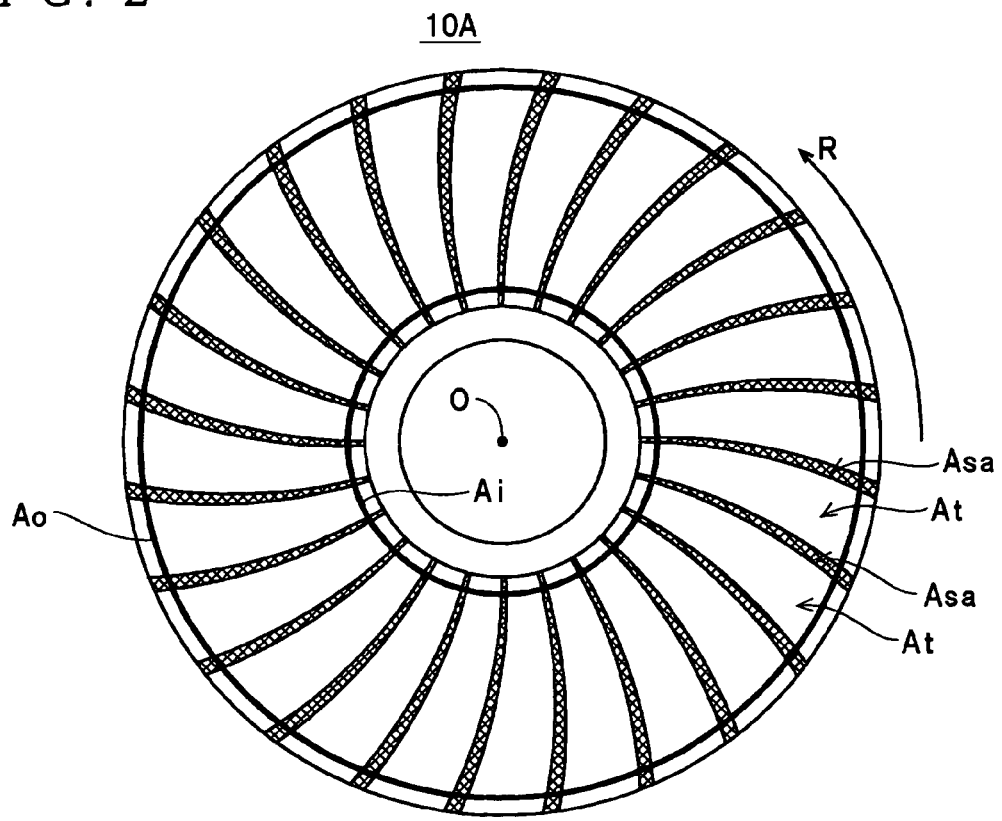
FIG. 2 is a plan view of a magnetic disk.

In this case, as shown in FIG. 2, in the magnetic disk 10A, servo pattern regions Asa are interposed between the data recording regions At such that the data recording regions At and the servo pattern regions Asa are alternately arranged in the rotating direction of the magnetic disk 10A (in the direction of an arrow R). It should be noted that, in this specification, the region, which is sandwiched between two data recording regions (in the example, data recording regions At) arranged side by side in the rotating direction (the region from the end of one data recording region on a rotating direction side to the end of other one data recording region on the rotating direction side) is arranged as the servo pattern regions (in the example, the servo pattern regions Asa). Further, it is assumed that the ends of the data recording regions on the rotating direction side are in coincidence with a virtual line (linear or arc line segment along the radius direction of the magnetic disk) connecting the respective ends of the plurality of data recording tracks (the convex portions 40a to be described later) formed in the data recording regions on the rotating direction side thereof.

Further, in the hard disk drive 1 on which the magnetic disk 10A is mounted, the motor 2 rotates the magnetic disk 10A at a constant angular speed under the control of the control section 6, as described above. Accordingly, in the magnetic disk 10A, the length of the data recording regions At along the rotating direction of the magnetic disk 10A and the length of the servo pattern regions Asa along the rotating direction are made longer in proportion to the length on the magnetic disk 10A passing under the magnetic head 3 per unit time as these regions are more separated from the center O of the data track pattern 40t (so that the data recording regions At and the servo pattern regions Asa are made wider in an outer peripheral region Ao than in an inner peripheral region Ai). As a result, the lengths along the rotating direction of the projecting end surfaces of the data recording tracks (convex portions 40a) formed in the data recording regions At, the reference lengths along the rotating direction of the projecting end surfaces of the respective convex portions 40a for the servo pattern 40sa formed in the servo pattern regions Asa, and the reference opening lengths along the rotating direction of the respective concave portions 40b for the servo pattern 40sa (for example, a length corresponding to a unit signal length) are made longer in the outer peripheral region Ao than in the inner peripheral region Ai. It should be noted that, in the following description, the length of the projecting end surface of the convex portion is also called a "length of the convex portion".

In this case, the reference lengths along the rotating direction of the projecting end surfaces of the convex portions 40*a* and the reference opening lengths along the rotating direction of the concave portions 40*b* in the servo pattern regions Asa are set to approximately the respective same lengths within the range of several tens of tracks which are disposed adjacent to each other in the radius direction of the magnetic disk 10A. Therefore, in the specification, the description will be made assuming that the reference lengths and the reference opening lengths along the rotating direction are equal to each other in the range of the several tens of tracks. Specifically, it is assumed, for example, that, in the range of several tens of tracks included in the inner peripheral region Ai, the reference lengths and the reference opening lengths along the rotating direction are equal to each other and that, in the range of several tens of tracks included in the outer peripheral region Ao, the reference lengths and the reference opening lengths along the rotating direction are equal to each other. Further, the opening lengths along the rotating direction of the concave portions 40*b* formed in the servo pattern regions Asa will be explained using corresponding opening lengths at the respective same radius positions (regions having the same radii) that have the same distances from the center O of the data track pattern 40*t* as a reference as long as there is no particular restriction.

Figure 3:
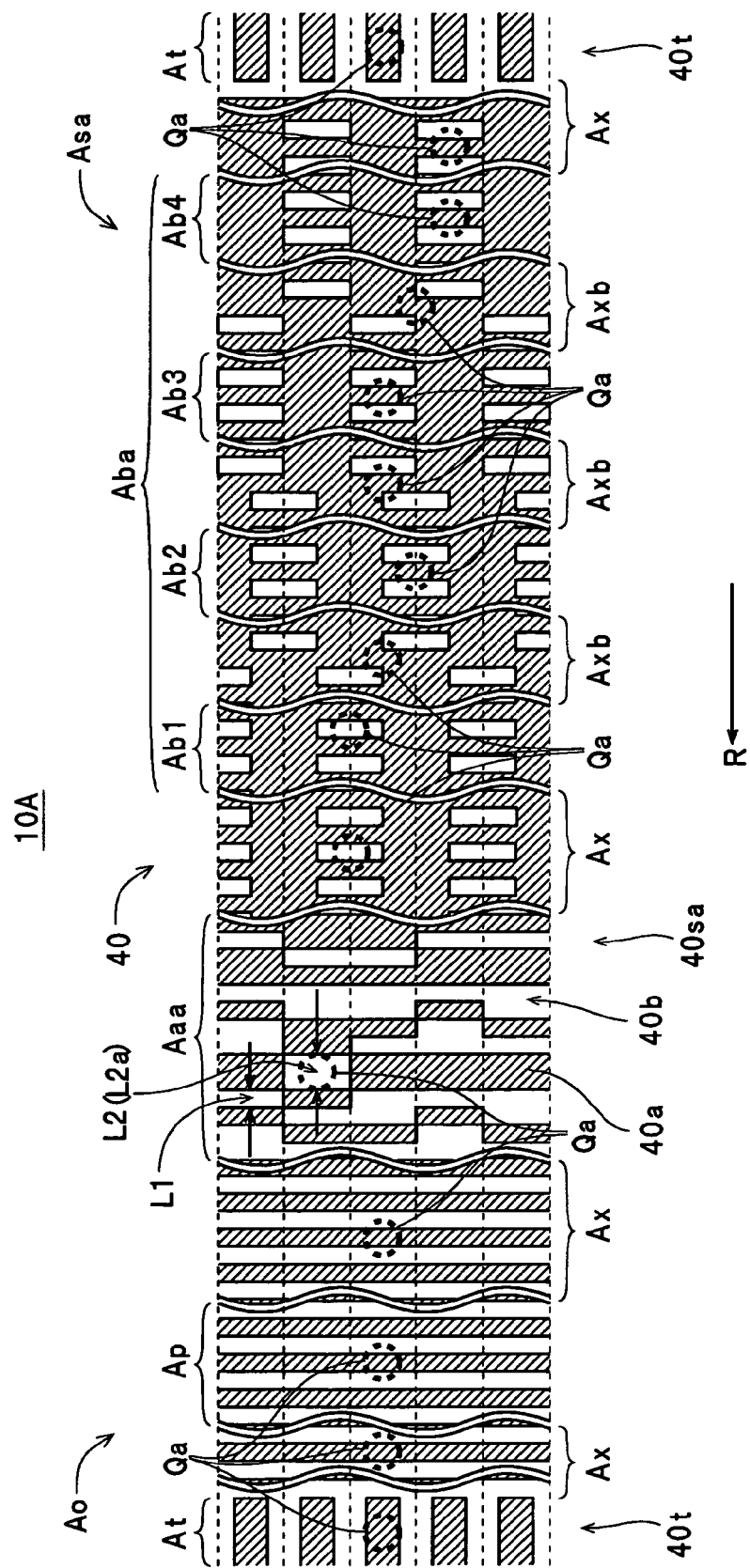
FIG. 3 is a plan view of a magnetic disk showing an example of various types of patterns formed in a data recording region and a servo pattern region in an outer peripheral region.
Figure 5:
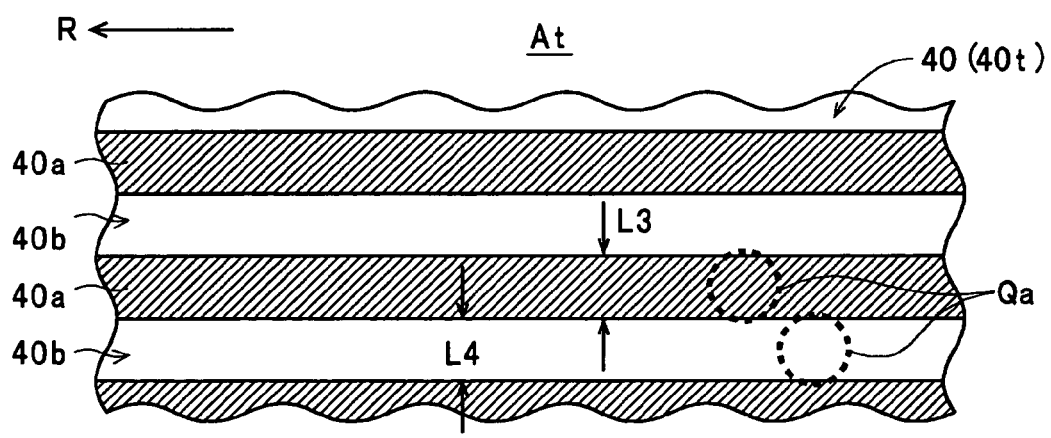
FIG. 5 is a plan view of the magnetic disk showing an example of a data track pattern formed in the data recording region.

Further, as shown in FIG. 3, a data track pattern 40*t* is formed in the data recording regions At. It should be noted that slanted regions in FIG. 3, and in FIGS. 5 to 9 and 24 to 26 to be referred to later show the regions in which the convex portions 40*a* are formed in the concave/convex pattern 40. In this case, as shown in FIG. 5, the data track pattern 40*t* is composed of a large number of the concentric (or spiral) convex portions 40*a* (data recording tracks) formed on the center O thereof (refer to FIG. 2) and the concave portions 40*b* (inter-track concave portions) between the convex portions 40*a*. It should be noted that although it is preferable that the center of rotation of the magnetic disk 10A is in coincidence with the center O of the data track pattern 40*t*, there may be caused a minute dislocation of about 30 to 50 μm therebetween due to a manufacturing error and the like. However, since a tracking servo control can be sufficiently executed to the magnetic head 3 even if the dislocation exists in the amount described above, it can be said that the center of rotation is substantially the same as the center O.

Further, as shown in FIG. 5, in the data recording regions At of the magnetic disk 10A, the lengths L3 of the projecting end surfaces of the convex portions 40*a* (data recording track) along the radius direction and the opening lengths L4 of the concave portions 40*b* (inter-track concave portion) along the radius direction have the respective same lengths (ratio of length: 1:1) as an example. Further, in the magnetic disk 10A, the lengths L3 of the convex portions 40*a* formed in the data recording regions At and the opening lengths L4 of the concave portions 40*b* along the radius direction formed thereto are set to the respective same lengths from the inner peripheral regions Ai to the outer peripheral regions Ao of the magnetic disk 10A. In this case, the opening lengths L4 of the concave portions 40*b* along the radius direction are set equal to or smaller than the respective maximum opening lengths (opening lengths L2*a* to be described later: refer to FIG. 7) of the respective opening lengths along the rotating direction of the concave portions 40*b* formed in the servo pattern regions Asa (address pattern regions Aaa). Further, the non-magnetic material 15 is filled in the concave portions 40*b* of the data track pattern 40*t*, thereby the data recording regions At are flattened.

In contrast, as shown in FIG. 3, the servo pattern 40*sa* having a preamble pattern formed in preamble pattern regions Ap, an address pattern formed in the address pattern regions Aaa, a burst pattern formed in burst pattern regions Aba, and a dummy pattern formed in non-servo signal regions Ax is formed in the servo pattern regions Asa. In this case, the servo pattern 40*sa* formed in the preamble pattern regions Ap, the address pattern regions Aaa, and the burst pattern regions Aba are equivalent to a pattern corresponding to a "tracking servo control signal" in the present invention. Further, in the servo pattern 40*sa*, the positions at which the convex portions 40*a* and the concave portions 40*b* are formed and the sizes thereof (the lengths, the opening lengths, and the like thereof along the rotating direction) are set corresponding to the "tracking servo control signal" in the present invention.

Figure 6:
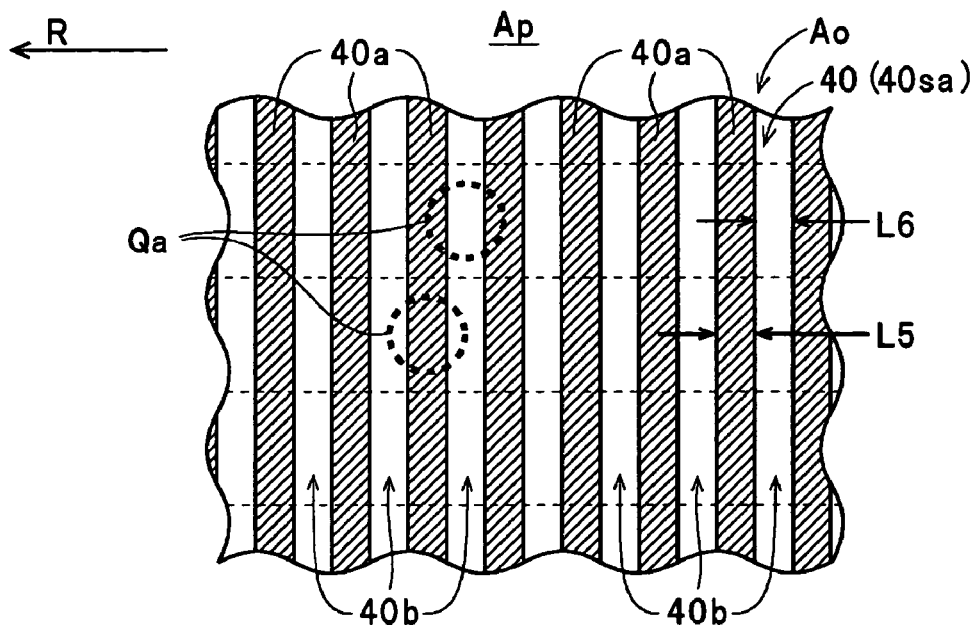
FIG. 6 is a plan view of the magnetic disk showing an example of a preamble pattern formed in a preamble pattern region in the outer peripheral region.

Specifically, the preamble pattern formed in the preamble pattern regions Ap is a servo pattern for correcting a reference clock for reading various control signals from the address pattern regions Aaa and the like according to the rotating state (rotating speed) of the magnetic disk 10A. As shown in FIG. 6, the strip-shaped convex portions 40*a* that are long in the radius direction (up/down direction in the figure) of the magnetic disk 10A are formed along the rotating direction (the direction of the arrow R) of the magnetic disk 10A across the concave portions 40*b*. In this case, the lengths L5 of the projecting end surfaces along the rotating direction of the convex portions 40*a* formed in the preamble pattern regions Ap and the opening lengths L6 of the concave portions 40*b* along the rotating direction are set such that they have the respective same lengths at the respective same radius positions having the same distances from the center O and are longer in the outer peripheral region Ao than in the inner peripheral region Ai. Further, the opening lengths L6 along the rotating direction of the concave portions 40*b* formed in the preamble pattern regions Ap are set, for example, such that they are equal to the respective minimum opening lengths (the opening lengths L1 to be described later: refer to FIG. 7) of the respective opening lengths along the rotating direction of the concave portions 40*b* formed in the address pattern regions Aaa at the respective same radius positions. It should be noted that the lengths L5 along the rotating direction of the convex portions 40*a* and the opening lengths L6 of the concave portions 40*b* in the preamble pattern are not limited to the above examples, and the lengths L5 of the convex portions 40*a* and the opening lengths L6 of the concave portions 40*b* may be set to respective lengths that are different from each other.

Figure 7:
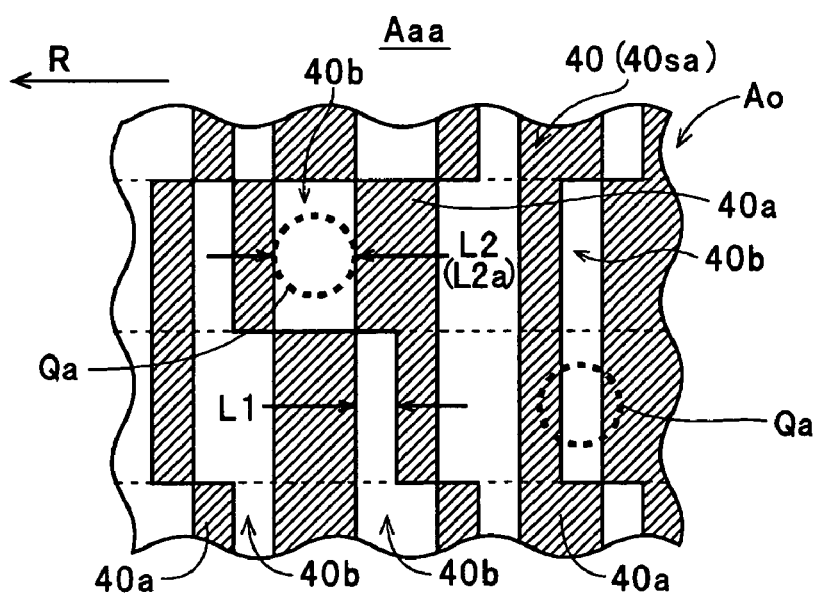
FIG. 7 is a plan view of the magnetic disk showing an example of an address pattern formed in an address pattern region in the outer peripheral region.

Further, the address pattern formed in the address pattern regions Aaa is a servo pattern formed in correspondence to the address data showing the track number and the like of a track on which the magnetic head 3 is placed. As shown in FIG. 7, the respective lengths along the rotating direction of the projecting end surfaces of the convex portions 40*a* and the respective opening lengths along the rotating direction of the concave portions 40*b* are set in correspondence to the address data. In this case, in the magnetic disk 10A, the address data is encoded according to Manchester code, Biphase-M code, and the like and recorded in the address pattern regions Aaa. Specifically, since the convex portions 40*a* are formed in correspondence to a high level of Manchester code and the concave portions 40*b* are formed in correspondence to a low level thereof, the concave/convex pattern 40 that corresponds to the data contents of the address data is formed in the address pattern regions Aaa.

In the magnetic disk 10A, the minimum lengths L1 at the respective same radius positions of the respective opening lengths along the rotating direction of the concave portions 40b formed in the address pattern regions Aaa are set, for example, equal to the respective opening lengths L6 along the rotating direction of the concave portions 40b formed in the preamble pattern regions Ap at the respective same radius positions. Further, the maximum opening lengths L2 (an example of the "first lengths" in the present invention) at the respective same radius positions of the respective opening lengths along the rotating direction of the concave portions 40b formed in the address pattern regions Aaa are set, for example, double the respective opening lengths L1 at the respective same radius positions. In this case, in the magnetic disk 10A, the reference opening lengths along the rotating direction are made longer in the outer peripheral region Ao than in the inner peripheral region Ai, as described above. Accordingly, in the magnetic disk 10A, the maximum opening lengths L2 of the respective opening lengths along the rotating direction of the concave portions 40b of the address pattern regions Aaa in the outer peripheral region Ao (hereinafter, when the maximum opening lengths of the respective opening lengths L2 are discriminated from the other lengths L2, the maximum lengths are also referred to as the "opening lengths L2a") are equivalent with the "maximum lengths of the respective first lengths" in the present invention, and the opening lengths L2a are the maximum opening lengths of the respective opening lengths along the rotating direction of the concave portions 40b in the servo pattern regions Asa. It should be noted that, in the magnetic disk 10A, since the address pattern is formed by encoding the address data according to Manchester code and the like, the opening lengths (signal lengths recognized as a low level in the hard disk drive 1) along the rotating direction of the respective concave portions 40b constituting the address pattern (servo pattern 40sa) at the respective same radius positions in the address pattern regions Aaa are composed of only the two types of the opening lengths L1 and L2.

Figure 8:
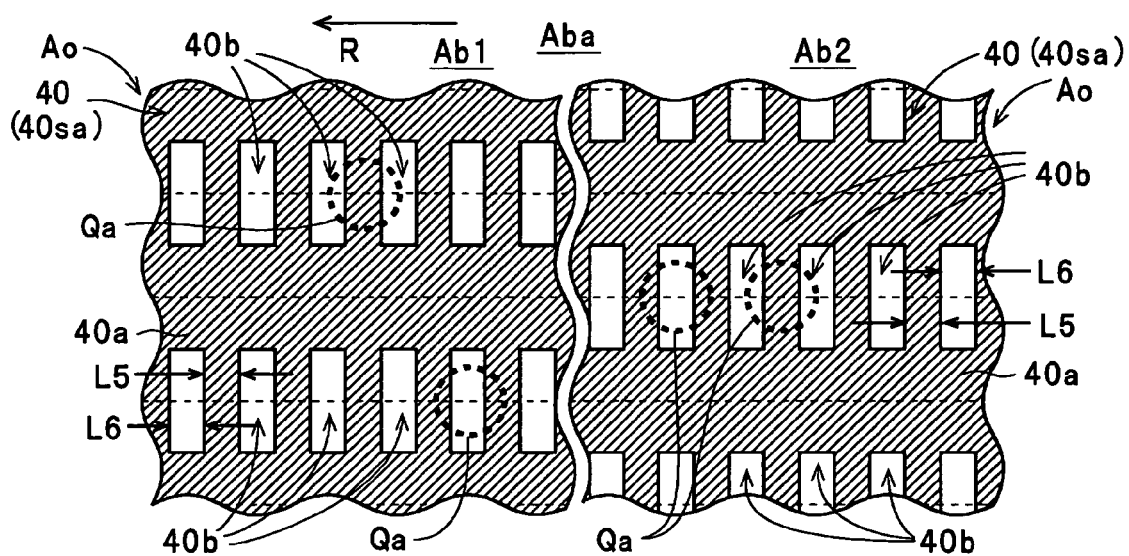
FIG. 8 is a plan view of the magnetic disk showing an example of burst patterns formed in a first burst pattern region and a second burst pattern region in the outer peripheral region.
Figure 9:
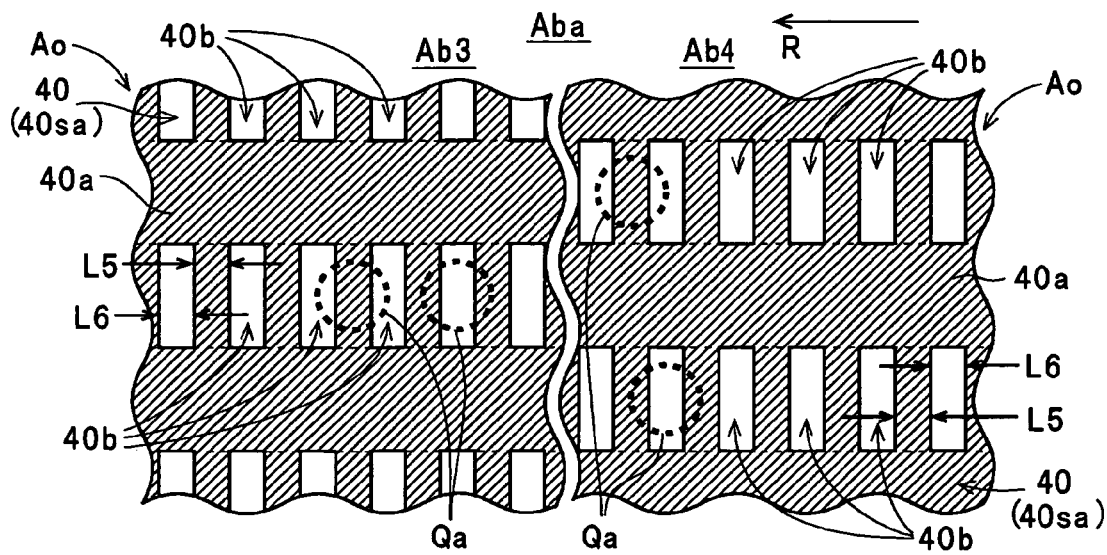
FIG. 9 is a plan view of the magnetic disk showing an example of burst patterns formed in a third burst pattern region and a fourth burst pattern region in the outer peripheral region.

Further, as shown in FIG. 3, the burst pattern regions Aba includes respective burst regions, that is, first burst regions Ab1 to fourth burst regions Ab4 and non-servo signal regions Axb. In this case, the burst patterns formed in the first burst regions Ab1 to the fourth burst regions Ab4 are position detecting servo patterns for placing the magnetic head 3 on a desired track. As shown in FIGS. 8 and 9, since the plurality of concave portions 40b are formed along the rotating direction of the magnetic disk 10A across the convex portions 40a, there are formed regions in which convex portions 40a and concave portions 40b are arranged alternately along the rotating direction and regions in which convex portions 40a are continuously arranged in the rotating direction. In this case, in the magnetic disk 10A, burst signal unit portions (a plurality of rectangular regions arranged along the rotating direction in the burst pattern regions Aba) in the burst pattern regions Aba are composed of the concave portions 40b. Accordingly, the pre-magnetic layers 14 in the burst pattern regions Aba have a sufficiently large surface area as compared with a magnetic disk whose burst signal unit portions are composed of convex portions 40a. As a result, when the burst pattern regions Aba passes below the magnetic head 3, the signal level of a signal output from the magnetic head 3 can be sufficiently enhanced.

In the magnetic disk 10A, the opening lengths L6 in the rotating direction of the concave portions 40b arranged along the rotating direction in the first burst regions Ab1 to the fourth burst regions Ab4 in the burst pattern regions Aba are set, for example, equal to the respective opening minimum lengths L1 along the rotating direction of the concave portions 40b formed in the address pattern regions Aaa at the respective same radius positions and to the respective opening lengths L6 along the rotating direction of the concave portions 40b formed in the preamble pattern regions Ap at the respective same radius positions. Further, the lengths L5 along the rotating direction of the convex portions 40a between the concave portions 40b formed in the burst pattern regions Aba are set, for example, equal to the respective lengths L5 along the rotating direction of the convex portions 40a formed in the preamble pattern regions Ap at the respective same radius positions. It should be noted that the lengths L5 along the rotating direction of the convex portions 40a between the concave portions 40b formed in the first burst regions Ab1 to the fourth burst regions Ab4 and the opening lengths L6 along the rotating direction of the concave portions 40b are not limited to the above examples. Further, the lengths L5 of the convex portions 40a and the opening lengths L6 of the concave portions 40b may be set to respective lengths that are different from each other.

Further, as shown in FIG. 3, the non-servo signal regions Ax are formed between the data recording regions At and the preamble pattern regions Ap, between the preamble pattern regions Ap and the address pattern regions Aaa, between the address pattern regions Aaa and the burst pattern regions Aba, and between the burst pattern regions Aba and the data recording regions At, respectively. Further, in the burst pattern regions Aba, the non-servo signal regions Axb are formed between the first burst regions Ab1 and the second burst regions Ab2, between the second burst regions Ab2 and the third burst regions Ab3, and between the third burst regions Ab3 and the fourth burst regions Ab4, respectively, as described above. These non-servo signal regions Ax, Axb are the regions in which a concave/convex pattern 40 is formed as a dummy pattern to forcibly and smoothly insert the convex portions 39a of a stamper 30 (refer to FIG. 11) into a resin layer 18 when the magnetic recording medium is manufactured. As an example, patterns of the same type (the same shape) as the various patterns formed in the preamble pattern regions Ap and the burst pattern regions Aba (the first burst regions Ab1 to the fourth burst regions Ab4) are formed as the dummy pattern.

Specifically, as shown in FIG. 3, a concave/convex pattern 40 of the same type as the servo pattern 40sa formed in the preamble pattern regions Ap is formed in the non-servo signal regions Ax (the non-servo signal regions Ax on the leftmost side in the figure) between the data recording regions At and the preamble pattern regions Ap. A concave/convex pattern 40 of the same type as the servo pattern 40sa formed in the fourth burst regions Ab4 in the burst pattern regions Aba is formed in the non-servo signal regions Ax (the non-servo signal regions Ax on the rightmost side in the figure) between the burst pattern regions Aba and the data recording regions At. A concave/convex pattern 40 of the same type as the servo pattern 40sa formed in the preamble pattern regions Ap is formed in the non-servo signal regions Ax between the preamble pattern regions Ap and the address pattern regions Aaa. A concave/convex pattern 40 of the same type as the servo pattern 40sa formed in the first burst regions Ab1 of the burst pattern regions Aba is formed in the non-servo signal regions Ax between the address pattern regions Aaa and the burst pattern regions Aba.

In the non-servo signal regions Axb between the first burst regions Ab1 and the second burst regions Ab2 (the non-servo signal regions Axb on the left side in the figure), a concave/convex pattern 40 of the same type as the servo pattern 40sa formed in the first burst regions Ab1 is formed on the first burst regions Ab1 side in the rotating direction as well as a concave/convex pattern 40 of the same type as the servo pattern 40sa formed in the second burst regions Ab2 is formed on the second burst pattern regions Ab2 side in the rotating direction. In the non-servo signal regions Axb between the second burst regions Ab2 and the third burst regions Ab3 (the non-servo signal regions Axb at the center in the figure), a concave/convex pattern 40 of the same type as the servo pattern 40sa formed in the second burst regions Ab2 is formed on the second burst regions Ab2 side in the rotating direction as well as a concave/convex pattern 40 of the same type as the servo pattern 40sa formed in the third burst regions Ab3 is formed on the third burst pattern regions Ab3 side in the rotating direction. Further, in the non-servo signal regions Axb between the third burst regions Ab3 and the fourth burst regions Ab4 (the non-servo signal regions Axb on the right side in the figure), a concave/convex pattern 40 of the same type as the servo pattern 40sa formed in the third burst regions Ab3 is formed on the third burst regions Ab3 side in the rotating direction as well as a concave/convex pattern 40 of the same type as the servo pattern 40sa formed in the fourth burst regions Ab4 is formed on the fourth burst pattern regions Ab4 side in the rotating direction.

Accordingly, in the magnetic disk 10A, it is visually recognized that the preamble pattern regions Ap, the address pattern regions Aaa, and the burst pattern regions Aba are continuously formed in contact with each other as if no non-servo signal region Ax exists in the servo pattern regions Asa as well as it is visually recognized that the respective burst regions from the first burst regions Ab1 to the fourth burst regions Ab4 are continuously formed in contact with each other as if no non-servo signal region Axb exists in the burst pattern regions Aba. However, when data is recorded to and reproduced from the magnetic disk 10A, although magnetic signals are read from the non-servo signal regions Ax, Axb by the magnetic head 3, the data corresponding to the concave/convex patterns 40 formed in the non-servo signal regions Ax, Axb is determined different from tracking servo data by the control section 6. Accordingly, the lengths of the convex portions 40a and the opening lengths of the concave portions 40b formed in the non-servo signal regions Ax, Axb can be arbitrarily set within the range in which the lengths are not affected by the lengths of the other patterns and a disadvantage is not caused in imprint processing executed in a manufacturing process. Further, the shapes of the convex portions 40a and the concave portions 40b may be also arbitrarily decided.

As described above, in the magnetic disk 10A, the opening lengths L4 along the radius direction of the concave portions 40b between the convex portions 40a formed in the data recording regions At are set equal to or less than the respective maximum opening lengths of the respective opening lengths along the rotating direction of the concave portions 40b formed in the servo pattern regions Asa (in the example, the maximum opening lengths L2a of the respective opening lengths along the rotating direction of the concave portions 40b in the address pattern regions Aaa in the outer peripheral region Ao). Accordingly, when circular regions Qa whose diameters are equal to the maximum opening lengths L2a in the address pattern regions Aaa are disposed to any portions in the data recording regions At as shown in FIG. 5, at least a portion of the convex portions 40a is included in the circular regions Qa. Further, in the magnetic disk 10A, the opening lengths L6 along the rotating direction of the concave portions 40b formed in the preamble pattern regions Ap are set equal to the respective minimum opening lengths L1 of the respective opening lengths along the rotating direction of the concave portions 40b formed in the servo pattern regions Asa at the respective same radius positions, as described above. In this case, since the lengths L1 are one half the lengths L2, as described above, when the circular regions Qa whose diameters are equal to the maximum lengths L2a in the address pattern regions Aaa are disposed to any portions in the preamble pattern regions Ap as shown in FIG. 6, at least a portion of the convex portions 40a is included in the circular regions Qa.

Further, in the magnetic disk 10A, the address pattern, in which the address data is encoded according to Manchester code and the like, is formed in the address pattern regions Aaa, as described above. Accordingly, even if a large number of "1"s continuously exist in the address data, the concave portions 40b are not continuously formed along the rotating direction, and the concave/convex pattern 40 (address pattern) is formed by the concave portions 40b having the opening lengths L1 (minimum lengths), the concave portions 40b having the opening lengths L2 (maximum lengths), and the convex portions 40a. In this case, since the opening lengths L1 are one half the opening lengths L2, when the circular regions Qa whose diameters are equal to the maximum opening lengths L2a in the address pattern regions Aaa are disposed to any portions in the address pattern regions Aaa, at least a portion of the convex portions 40a is included in the circular regions Qa. It should be noted that, in a state in which the circular regions Qa disposed in the address pattern regions Aaa are in coincidence with the inscribed circles of the concave portions 40b having the maximum opening lengths L2a in the address pattern regions Aaa, the boundary portions between the convex portions 40a and the concave portions 40b are included in the circular regions Qa. In this case, the state in which the boundary portions between the convex portions 40a and the concave portions 40b are included is referred to as a "state in which a part of the convex portions 40a is included" in the specification, as described above.

Further, in the magnetic disk 10A, the opening lengths L6 along the rotating direction of the concave portions 40b formed in the first burst regions Ab1 to the fourth burst regions Ab4 in the burst pattern regions Aba are set equal to the respective minimum opening lengths L1 of the respective opening lengths along the rotating direction of the concave portions 40b formed in the servo pattern regions Asa at the respective same radius positions, as described above. In this case, since the opening lengths L1 are one half the opening lengths L2, when the circular regions Qa whose diameters are equal to the maximum opening lengths L2a in the address pattern regions Aaa are disposed to any portions in the first burst regions Ab1 to the fourth burst regions Ab4 as shown in FIGS. 8 and 9, at least a portion of the convex portions 40a is included in the circular regions Qa.

Further, in the magnetic disk 10A, the concave/convex pattern 40 of the same type as the servo pattern 40sa formed in the preamble pattern regions Ap and the burst pattern regions Aba (the first burst regions Ab1 to the fourth burst regions Ab4) is formed in the non-servo signal regions Ax, Axb, as described above. Accordingly, even if the circular regions Qa are disposed at any positions in the preamble pattern regions Ap and the burst pattern regions Aba (the first burst regions Ab1 to the fourth burst regions Ab4) as shown in FIG. 3, when the circular regions Qa are disposed in any portions of the non-servo signal regions Ax, Axb in which the servo pattern 40sa of the same type as these regions are formed in the magnetic disk 10A in which at least a portion of the convex portions 40a is included in the circular regions Qa, at least a portion of the convex portions 40a is included in the circular regions Qa.

As described above, in the magnetic disk 10A, the data track pattern 40t and the servo pattern 40sa are arranged by forming the convex portions 40a such that at least a part of the convex portions 40a is included in the arbitrarily disposed circular regions Qa in the entire areas of the data recording regions At, and the servo pattern regions Asa. In other words, in the entire areas of the data recording regions At and the servo pattern regions Asa of the magnetic disk 10A, the opening lengths in any direction of the opening surfaces of the concave portions 40b (in the example, any of the opening lengths along the rotating direction of the concave portions 40b and the opening lengths along the radius direction thereof) are shorter than (or equal to) the diameters of the circular regions Qa (in the example, the opening lengths L2a). That is, in the magnetic disk 10A, the data track pattern 40t and the servo pattern 40sa are formed such that the concave portions 40b whose opening surfaces are excessively wide do not exist in any region of the data recording regions At and the servo pattern regions Asa, unlike in the conventional magnetic disk 10z.

Next, a method of manufacturing the magnetic disk 10A will be explained.

Figure 10:
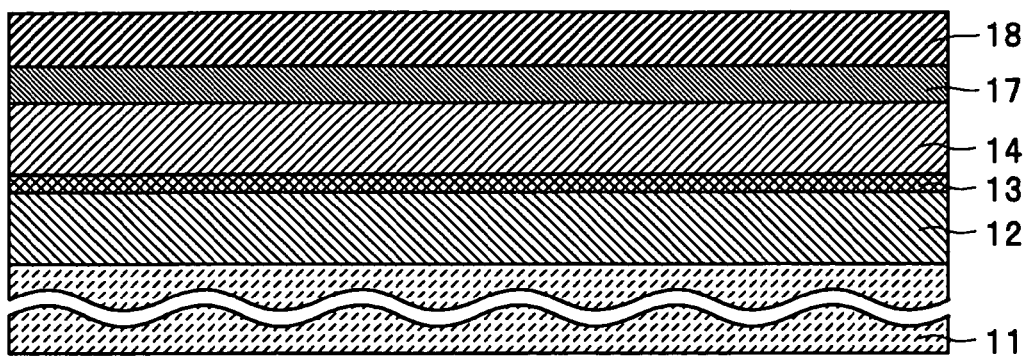
FIG. 10 is a cross-sectional view showing a layer structure of an intermediate body.
Figure 11:
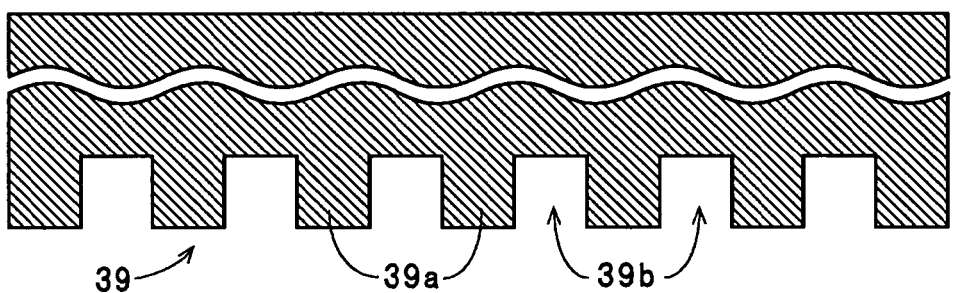
FIG. 11 is a cross-sectional view of a stamper.

When the magnetic disk 10A is manufactured, an intermediate body 20 shown in FIG. 10 and a stamper 30 shown in FIG. 11 are used. In this case, as shown in FIG. 10, the intermediate body 20 is composed of the soft magnetic layer 12, the intermediate layer 13, and the magnetic layer 14 formed on the glass substrate 11 in this order. Further, a mask layer 17 and a resin layer (resist layer) 18 having a thickness of about 80 nm are formed on the magnetic layer 14. In contrast, the stamper 30 is an example of a stamper for manufacturing the magnetic recording medium according to the present invention. As shown in FIG. 11, a concave/convex pattern 39 that can form a concave/convex pattern 41 for forming the concave/convex pattern 40 (the data track pattern 40t and the servo pattern 40sa) of the magnetic disk 10A is formed on the stamper 30, and the stamper 30 is arranged to manufacture the magnetic disk 10A by an imprint method. In this case, the concave/convex pattern 39 of the stamper 30 is formed such that convex portions 39a correspond to the concave portions 40b of the concave/convex pattern 40 of the magnetic disk 10A and concave portions 39b correspond to the convex portions 40a of the concave/convex pattern 40. Accordingly, the concave/convex pattern 39 of the stamper 30 is composed of the convex portions 39a, which are formed to have no excessively wide projecting end surfaces, and the concave portions 39b.

Figure 12:
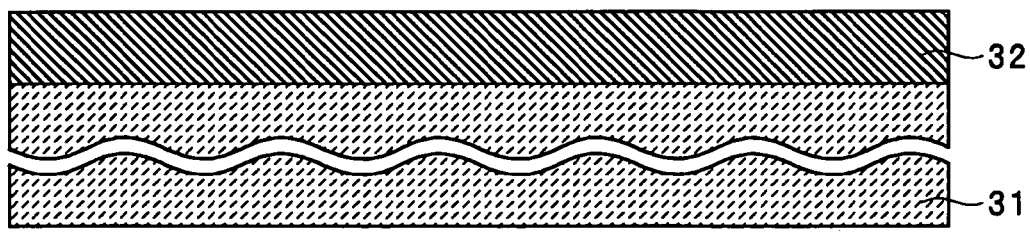
FIG. 12 is a cross-sectional view showing a state in which a resist layer is formed on a glass substrate.
Figure 13:
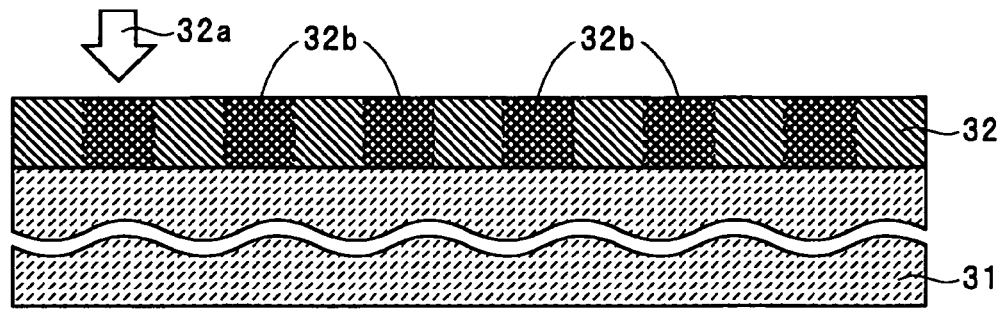
FIG. 13 is a cross-sectional view of a state in which a latent image is formed by irradiating an electronic beam onto the resist layer.
Figure 14:
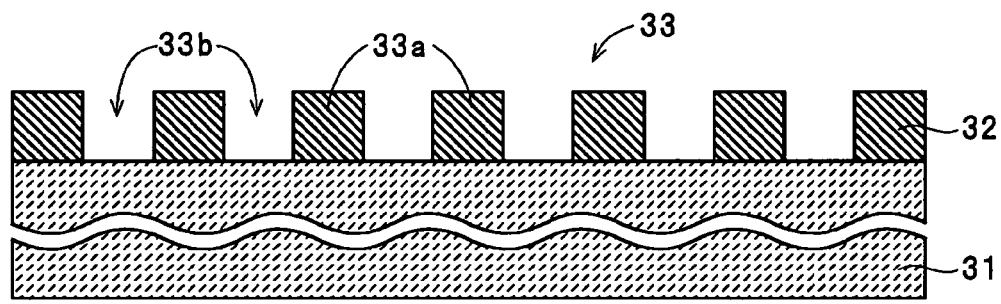
FIG. 14 is a cross-sectional view of a state in which a concave/convex pattern is formed by subjecting the resist layer on which the latent image is formed to development processing.
Figure 15:
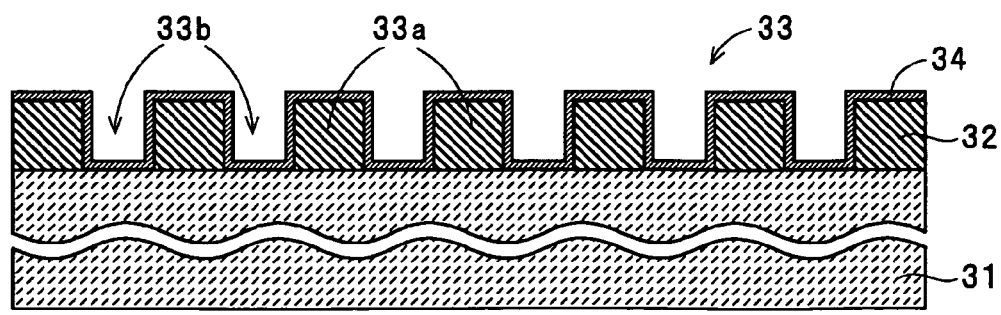
FIG. 15 is a cross-sectional view of a state in which a nickel layer is formed to cover the concave/convex pattern formed by the development processing.
Figure 16:
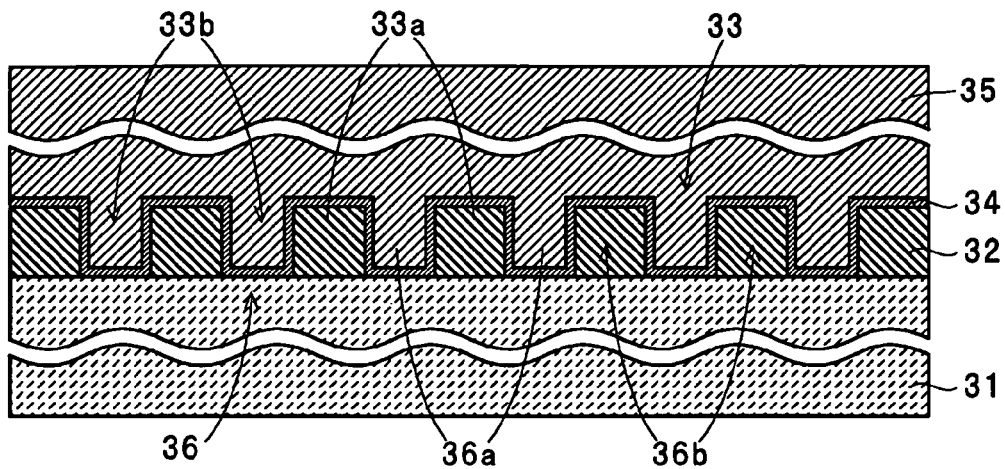
FIG. 16 is a cross-sectional view of a state in which other nickel layer is formed by plating processing making use of the thus formed nickel layer.

When the stamper 30 is manufactured, first, after a positive-type resist, for example, is spin coated on an glass substrate 31, the positive-type resist is subjected to bake processing, thereby a resist layer 32 having a thickness of about 150 nm is formed on the glass substrate 31 as shown in FIG. 12. Next, as shown in FIG. 13, a latent image 32b (the track pattern and the servo pattern) is formed on the resist layer 32 by irradiating an electron beam 32a onto the portions corresponding to the concave portions 39b of the stamper 30 (that is, the portions corresponding to the convex portions 40a of the magnetic disk 10A). Subsequently, as shown in FIG. 14, a concave/convex pattern 33 (convex portions 33a and concave portions 33b) composed of the resist layer 32 is formed on the glass substrate 31 by subjecting the resist layer 32 to development processing. Next, as shown in FIG. 15, a nickel layer 34 having a thickness of about 30 nm is formed by sputtering so that it covers the convex portions 33a and the concave portions 33b of the concave/convex pattern 33. Subsequently, as shown in FIG. 16, a nickel layer 35 is formed on the nickel layer 34 by executing plating processing using the nickel layer 34 as an electrode. At the time, the concave/convex pattern 33 formed by the resist layer 32 is transferred onto the laminated body of the nickel layers 34 and 35 and concave portions 36b are formed to the portions of the convex portions 33a in the concave/convex pattern 33 as well as convex portions 36a are formed to the portions of the concave portions 33b, thereby a concave/convex pattern 36 is formed to the laminated body of the nickel layers 34, 35.

Figure 17:
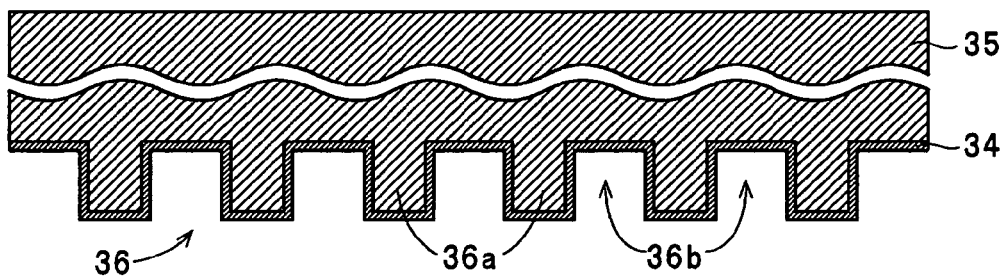
FIG. 17 is a cross-sectional view of a stamper formed by exfoliating the laminated body of both the nickel layers from the glass substrate.
Figure 18:
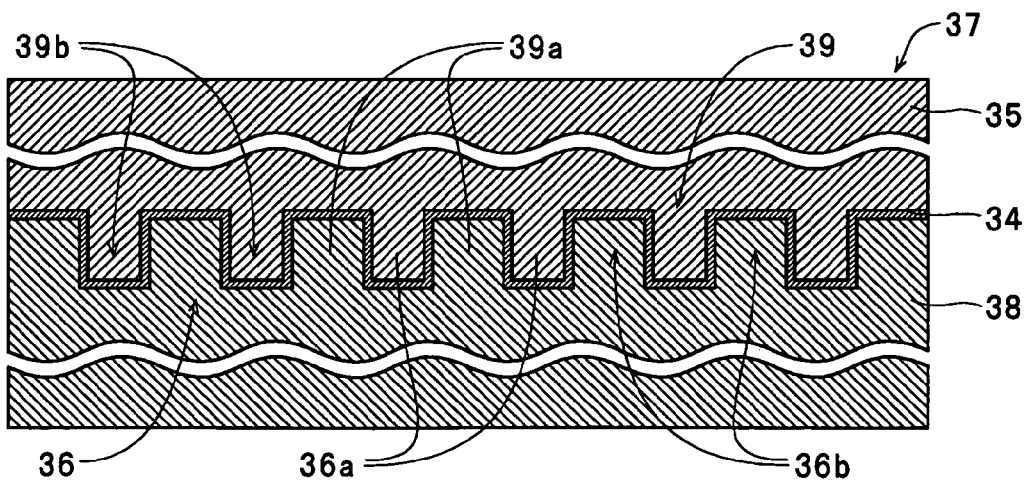
FIG. 18 is a cross-sectional view of a state in which a nickel layer is formed on the surface of the stamper on which the concave/convex pattern is formed (state in which the nickel layer is transferred onto the concave/convex pattern of the stamper)

Subsequently, the resist layer 32 between the laminated body of the nickel layers 34, 35 and the glass substrate 31 is eliminated by dipping the glass substrate 31, the resist layer 32, and the laminated body of the glass substrate 31 into a resist exfoliation liquid. With this operation, the laminated body of the nickel layers 34, 35 is exfoliated from the glass substrate 31, thereby a stamper 37 is completed as shown in FIG. 17. Next, the stamper 30 (mother stamper) is manufactured using the stamper 37 as a master stamper. Specifically, first, an oxide film is formed on the surface of the stamper 37 on which the concave/convex pattern 36 is formed by subjecting the stamper 37 to surface processing. Next, as shown in FIG. 18, the stamper 37, on which the oxide film is formed, is subjected to plating processing to thereby form a nickel layer 38 on the stamper 37. At the time, the concave/convex pattern 36 of the stamper 37 is transferred onto the nickel layer 38 and concave portions 39b are formed to the portions of the convex portions 36a as well as convex portions 39a are formed to the portions of the concave portions 36b, thereby a concave/convex pattern 39 is formed to the nickel layer 38. Next, after the stamper 37 is exfoliated from the nickel layer 38, the back surface of the nickel layer 38 (back surface with respect to the surface on which the concave/convex pattern 39 is formed) is subjected to polish processing and flattened, thereby the stamper 30 is completed as shown in FIG. 11.

In contrast, when the intermediate body 20 is manufactured, first, after the soft magnetic layer 12 is formed on the glass substrate 11 by sputtering CoZrNb alloy on the glass substrate 11, the intermediate layer 13 is formed by sputtering an intermediate layer forming material on the soft magnetic layer 12. Next, the magnetic layer 14 having a thickness oxide film about 15 nm is formed by sputtering CoCrPt alloy on the intermediate layer 13. Subsequently, the mask layer 17 is formed on the magnetic layer 14, and further the resin layer 18 having a thickness of about 80 nm is formed by spin coating, for example, a resist on the mask layer 17. With this operation, the intermediate body 20 is completed as shown in FIG. 10.

Figure 19:
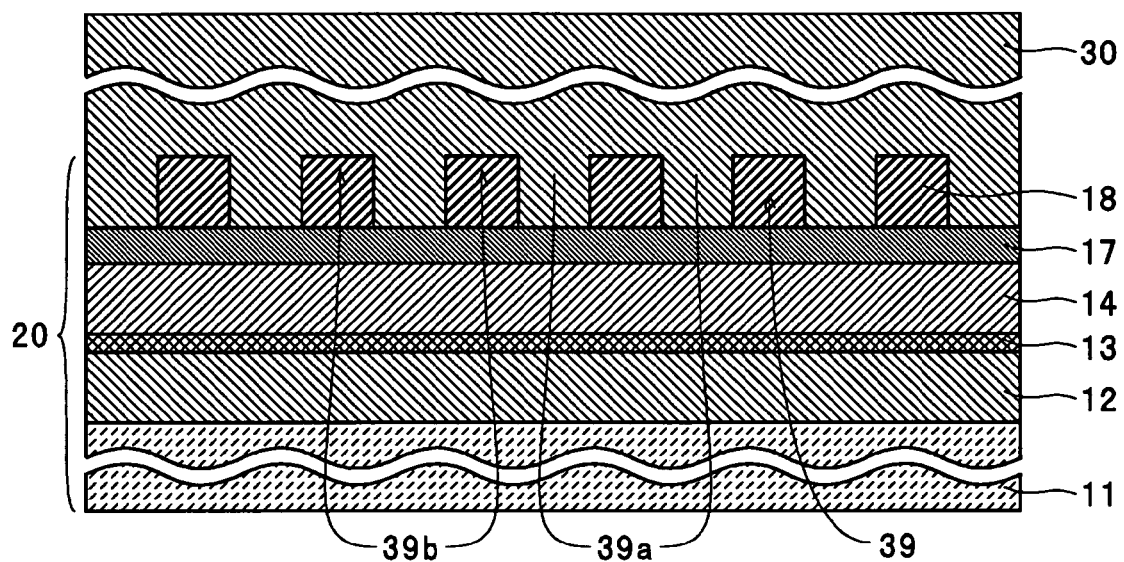
FIG. 19 is a cross-sectional view of a state in which the concave/convex pattern of the stamper is pressed against a resin layer of the intermediate body.

Subsequently, as shown in FIG. 19, the concave/convex pattern 39 of the stamper 30 is transferred onto the resin layer 18 of the intermediate body 20 by the imprint method. Specifically, the surface of the stamper 30, on which the concave/convex pattern 39 is formed, is pressed against the resin layer 18 of the intermediate body 20, thereby the convex portions 39a of the concave/convex pattern 39 are forcibly inserted into the resin layer 18 of the intermediate body 20. In this case, in the magnetic disk 10A manufactured using the stamper 30, the opening lengths in any direction of the opening surfaces of the concave portions 40b (in the example, any of the opening lengths along the rotating direction of the concave portions 40b and the opening lengths along the radius direction thereof) are shorter than (or equal to) the diameters of the circular regions Qb (in the example, the opening lengths L2a) in the entire area of the servo pattern regions Asa and in the entire area of the data recording regions At, as described above. Accordingly, the concave portions 39b are formed to the stamper 30 for manufacturing the magnetic disk 10A such that no convex portions 39a having projecting end surfaces in which inscribed circles whose diameters exceed the diameters of the circular regions Qa (in the example, the opening lengths L2a) do not exist (no convex portions 39a whose projecting end surfaces are excessively wide do not exist) in the entire areas corresponding to the servo pattern regions Asa and the data recording regions At of the magnetic disk 10A. Accordingly, the convex portions 39a are forcibly inserted into the resin layer 18 smoothly, thereby they are forcibly inserted into the resin layer 18 sufficiently deeply without forming a thick residual between the extreme end portions of the convex portions 39a of the stamper 30 and the mask layer 17 of the intermediate member 20.

Figure 20:
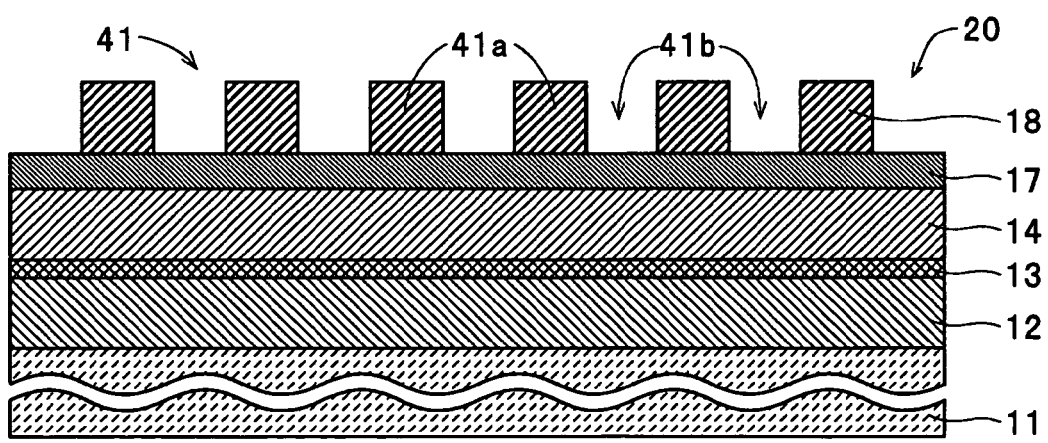
FIG. 20 is a cross-sectional view of a state in which the stamper is exfoliated from the resin layer in the state shown in FIG. 19 and a concave/convex pattern (resin mask) is formed on a mask layer.
Figure 21:
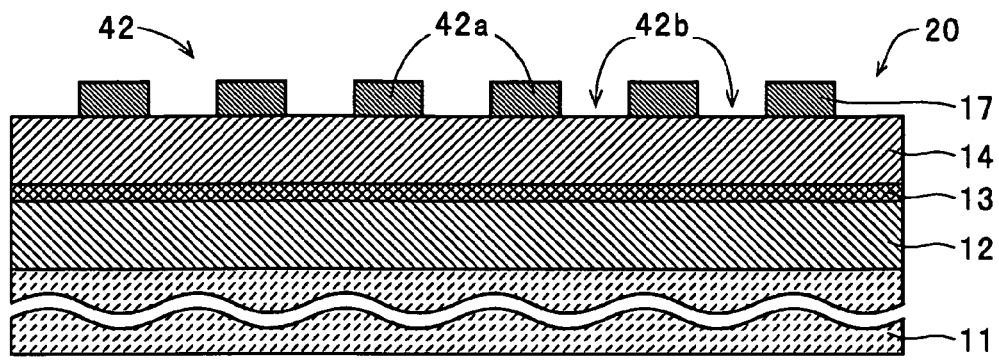
FIG. 21 is a cross-sectional view of a state in which the mask layer is etched using the concave/convex pattern shown in FIG. 20 as a mask and a concave/convex pattern (mask) is formed on a magnetic layer.
Figure 22:
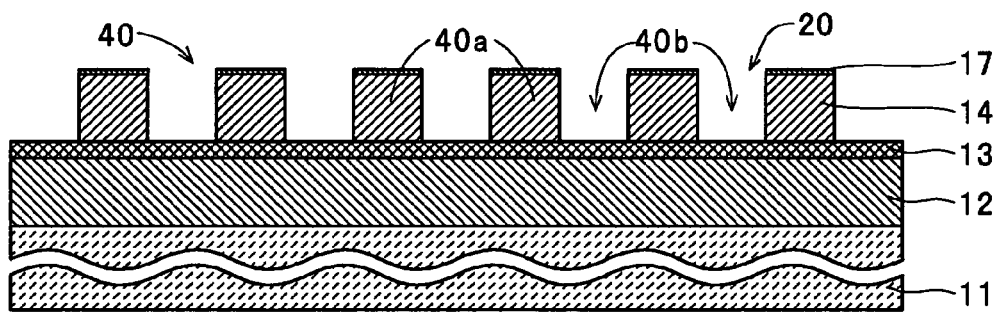
FIG. 22 is a cross-sectional view of a state in which a concave/convex pattern is formed on an intermediate layer by etching the magnetic layer using the concave/convex pattern shown in FIG. 21 as a mask.

Subsequently, the stamper 30 is exfoliated from the intermediate body 20 and further resin (residual) remaining on a bottom surface is eliminated by oxygen plasma processing, thereby a concave/convex pattern 41 composed of the resin layer 18 is formed on the mask layer 17 in the intermediate body 20 as shown in FIG. 20. Next, the mask layer 17, which is exposed from the mask (convex portions 41a) on the bottoms of the concave portions 41b of the concave/convex pattern 41, is etched by executing etching processing using the concave/convex pattern 41 (resin layer 18) as a mask, thereby a concave/convex pattern 42 having convex portions 42a and concave portions 42b is formed to the mask layer 17 of the intermediate body 20. Subsequently, etching processing is executed using the concave/convex pattern 42 (mask layer 17) as a mask to thereby etch the magnetic layer 14 exposed from the mask (convex portions 42a) on the bottoms of the concave portions 42b in the concave/convex pattern 42. With this operation, the concave/convex pattern 40 (data track pattern 40t and servo pattern 40s), which has the convex portions 40a whose projecting end surfaces are approximately as wide as the opening surfaces of the concave portions 39b of the stamper 30 and the concave portions 40b whose opening surfaces are approximately as wide as the projecting end surfaces of the convex portions 39a of the stamper 30, is formed on the magnetic layer 14 of the intermediate body 20 as shown in FIG. 22. Next, the mask layer 17 remaining on the convex portions 40a is selectively subjected to etching processing and completely eliminated, thereby the projecting end surfaces of the convex portions 40a are exposed.

Figure 23:
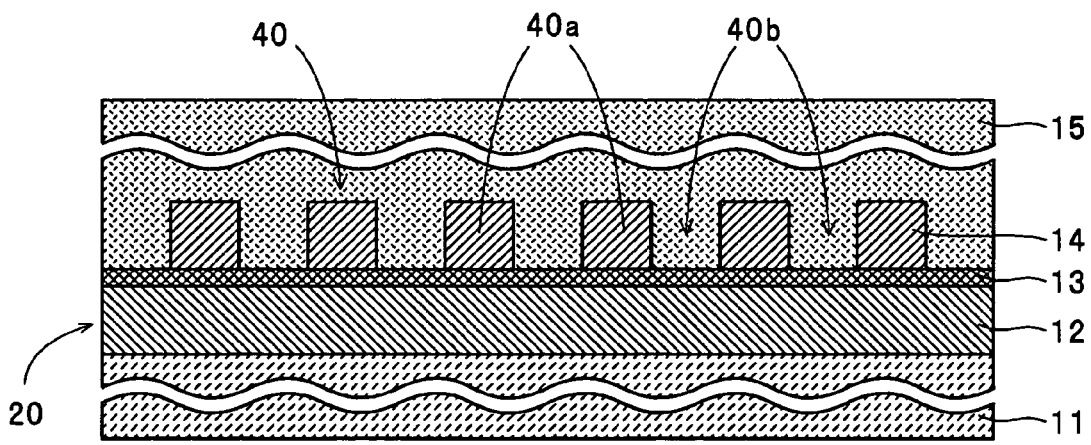
FIG. 23 is a cross-sectional view of the intermediate body in a state in which after the mask layer on the concave/convex pattern shown in FIG. 22 is removed, a layer of a non-magnetic material is formed to cover the concave/convex pattern.

Next, SiO$_2$ as the non-magnetic material 15 is sputtered as shown in FIG. 23. At the time, the non-magnetic material 15 is sufficiently sputtered so that the concave portions 40b are completely filled with the non-magnetic material 15 as well as a layer of the non-magnetic material 15 having a thickness of, for example, about 60 nm is formed on the convex portions 40a. Subsequently, ion beam etching is executed to the layer of the non-magnetic material 15 on the magnetic layer 14 (on the convex portions 40a and on the concave portions 40b). At the time, ion beam etching processing is continued until the projecting end surfaces of the convex portions 40a are exposed from the non-magnetic material 15, thereby the surface of the intermediate body 20 is flattened. Subsequently, after the protection layer 16 is formed by forming a thin film of diamond-like carbon (DLC) to cover the surface of the intermediate body 20 by a CVD method, a fomblin lubricant is applied to the surface of the protection layer 16 in a thickness of, for example, about 2 nm. With this operation, the magnetic disk 10A is completed as shown in FIG. 4.

In the hard disk drive 1 on which the magnetic disk 10A is mounted, when data is recorded to and reproduced from the magnetic disk 10A, the data corresponding to the concave/convex patterns 40 formed to the non-servo signal regions Ax and to the non-servo signal regions Axb is determined different from tracking servo data by the control section 6, as described above. Specifically, the control section 6 places the magnetic head 3 on a desired track by driving the actuator 3b by controlling the driver 5 based on the data, which corresponds to the concave/convex pattern 40 formed to the preamble pattern regions Ap, the address pattern regions Aaa, and the burst pattern regions Aba (except the non-servo signal regions Axb) of the data including the servo data output from the detection section 4.

Further, in the hard disk drive 1, when the address data is extracted based on the data output from the detection section 4 in correspondence to the concave/convex pattern 40 formed to the address pattern regions Aaa, the control section 6 decodes the output data from the detection section 4 assuming that it is encoded according to Manchester code, Biphase-M Code, and the like. As a result, a tracking servo control is executed based on the address data read out from the address pattern regions Aaa, the burst signal read out from the burst pattern regions Aba, and the like, thereby the magnetic head 3 can be placed on a desired data recorded track (convex portions 40a). With this operation, data can be recorded and reproduced through the magnetic head 3 placed on the convex portions 40a (data recording tracks) in the data recording regions At.

As described above, according to the magnetic disk 10A and the hard disk drive 1, the convex portions 40a are formed to the address pattern regions Aaa such that the maximum lengths L2, which are located in the respective same radius regions, of the respective opening lengths along the rotating direction of the concave portions 40b, are set to lengths that are double the minimum opening lengths L1 along the rotating direction of the concave portions 40b in the respective same radius regions (first lengths of the present invention). Accordingly, there exist no concave portions 40b whose opening lengths are excessively long along the rotating direction (concave portions 40b whose opening lengths are long in all the directions) in the address pattern regions Aaa in which the opening lengths along a radius direction of the concave portions 40b tend to increase. As a result, when the imprint processing is executed to form the concave/convex pattern 40 in the address pattern regions Aaa (in the example, when the concave/convex pattern 39 of the stamper 30 is transferred onto the resin layer 18 of the intermediate body 20), the convex portions 39a of the stamper 30 can be forcibly inserted into the resin layer 18 smoothly without using a stamper having convex portions whose projecting end surfaces are excessively wide. With this arrangement, since a thick residual can be prevented from being formed on the mask layer 17 in the imprint processing, the concave portions 41b can be prevented from being made excessively wide by residual elimination processing. Accordingly, the concave portions 40b formed finally in the portions of the concave portions 41b can be prevented from being made excessively wide. Thus, there can be provided the magnetic disk 10A that can accurately read the address data and the hard disk drive 1 including the magnetic disk 10A.

According to the magnetic disk 10A and the hard disk drive 1, when the circular regions Qa whose diameters are equal to the maximum opening lengths L2a of the respective opening lengths L2 (first lengths) are disposed in any portions in the servo pattern regions Asa, since the convex portions 40a are formed to the servo pattern regions Asa such that at least a portion of the convex portions 40a is included in the circular regions Qa, no concave portions 40b whose opening lengths are excessively long in all the direction (whose opening surfaces are excessively wide) exist not only in the entire region of the address pattern regions Aaa but also in the entire region of the servo pattern regions Asa. As a result, when the imprint processing is executed to form the concave/convex pattern 40 in the servo pattern regions Asa, the convex portions 39a of the stamper 30 can be forcibly inserted into the resin layer 18 smoothly without using a stamper having convex portions whose projecting end surfaces are excessively wide. With this arrangement, since a thick residual can be prevented from being formed on the mask layer 17 in the imprint processing, the concave portions 41b can be prevented from being made excessively wide by residual elimination processing. Accordingly, the concave portions 40b formed finally in the portions of the concave portions 41b can be prevented from being made excessively wide. Thus, there can be provided the magnetic disk 10A that can accurately read tracking servo control data and the hard disk drive 1 including the magnetic disk 10A.

Further, according to the magnetic disk 10A and the hard disk drive 1, the respective data recording tracks are formed such that the opening lengths L4 along a radius direction of the substrate of the concave portions 40b (inter-track concave portions) between the adjacent data recording tracks (convex portions 40a) are equal to or less than the maximum opening lengths L2a of the respective opening lengths L2 (first lengths). Accordingly, there exist no concave portions 40b whose opening lengths along a radius direction are excessively long (concave portions 40b whose opening lengths are long in all the directions) in the data recording regions At in which the opening lengths along the rotating direction of the concave portions 40b (inter-track concave portions) are made long. As a result, when the imprint processing is executed to form the concave/convex pattern 40 in the data recording regions At, the convex portions 39a of the stamper 30 can be forcibly inserted into the resin layer 18 smoothly without using a stamper having convex portions whose projecting end surfaces are excessively wide. With this arrangement, since a thick residual can be prevented from being formed in the imprint processing, the concave portions 41b can be prevented from being made excessively wide by the residual elimination processing. Accordingly, the concave portions 40b formed finally in the portions of the concave portions 41b can be prevented from being made excessively wide. Thus, there can be provided the magnetic disk 10A that can stably record and reproduce data and the hard disk drive 1 including the magnetic disk 10A.

According to the hard disk drive 1, since it is provided with the magnetic disk 10A and the control section 6 for executing tracking servo control processing based on a predetermined signal read from the servo pattern regions Asa of the magnetic disk 10A, data can be recorded and reproduced through the magnetic head 3 placed on the convex portions 40a (data recording tracks) in the data recording regions At without being affected by the existence of the concave/convex pattern 40 (dummy pattern) formed in the non-servo signal regions Ax.

Further, according to the stamper 30 for manufacturing the magnetic disk 10A, the concave/convex pattern 39 is formed which has the convex portions 39a formed in correspondence to the concave portions 40b of the concave/convex pattern 40 of the magnetic disk 10A and the concave portions 39b formed in correspondence to the convex portions 40a of the concave/convex pattern 40 of the magnetic disk 10A. Thus, since the stamper 30 has no convex portions 39a whose projecting end surfaces are excessively wide (for example, convex portions 39a whose lengths along the rotating direction and along a radius direction are excessively long), the concave/convex pattern 39 (convex portions 39a) can be forcibly inserted into the intermediate body 20 smoothly. Accordingly, the occurrence of disadvantage due to an insufficient amount of forcible insertion of the convex portions 39a can be prevented in the imprint processing (excessive expansion of the respective concave portions 41b caused by the residual elimination processing). As a result, the magnetic disk 10A, which can securely read the address data and the like, can be manufactured.

Next, an example, in which a magnetic disk 10B as another example of the magnetic recording medium according to the present invention is mounted on the hard disk drive 1, will be explained with reference to the drawings. It should be noted that the components which are common to those of the magnetic disk 10A described above and the hard disk drive 1 on which the magnetic disk 10A is mounted are denoted by common reference numerals and the description thereof is omitted.

Figure 24:
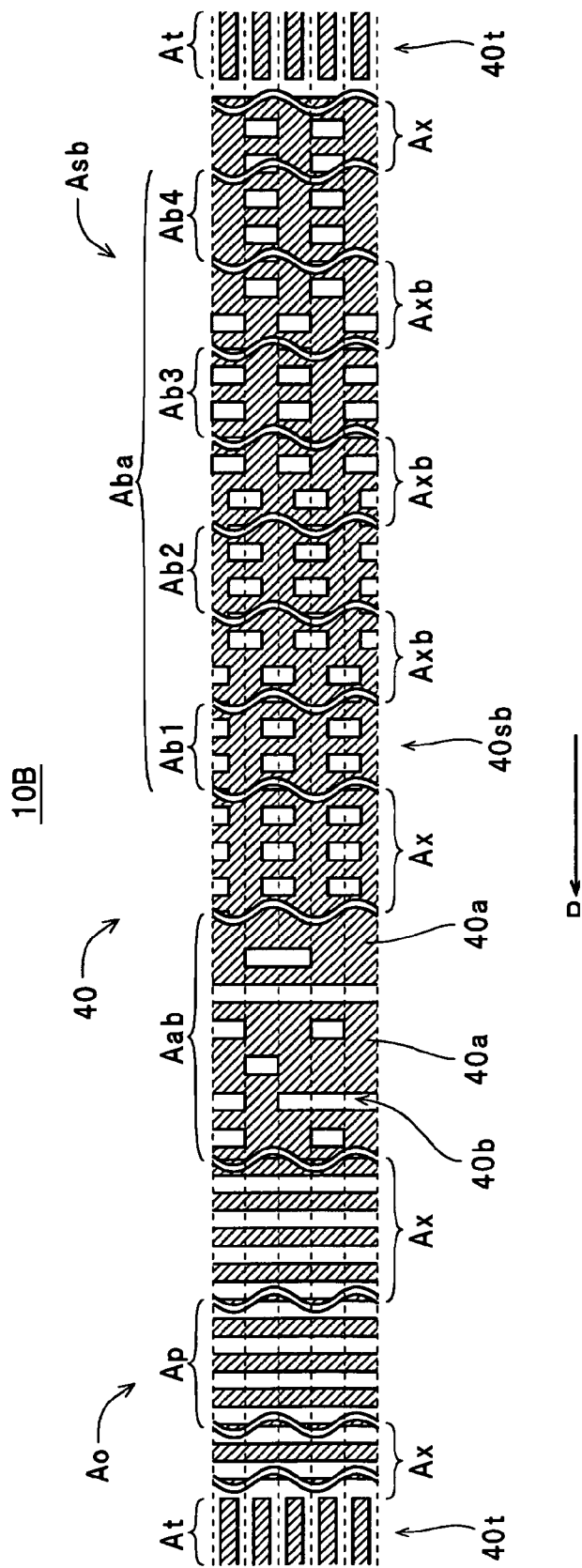
FIG. 24 is a plan view of another magnetic disk showing an example of various types of patterns formed in a data recording region and a servo pattern region in an outer peripheral region.

In the magnetic disk 10B, servo pattern regions Asb is formed between data recording regions At in place of the servo pattern regions Asa in the magnetic disk 10A as shown in FIG. 24. The servo pattern regions Asb has address pattern regions Aab in place of the address pattern regions Aaa of the servo pattern regions Asa of the magnetic disk 10A. In this case, in the magnetic disk 10B, a servo pattern 40sb formed in preamble pattern regions Ap, address pattern regions Aab, and burst pattern regions Aba is equivalent to a pattern corresponding to a "tracking servo control signal" in the present invention. In the magnetic disk 10B, the opening lengths L4 along a radius direction of concave portions 40b (inter-track concave portions) of the convex portions 40a (data recording tracks) of a data track pattern 40t formed in the data recording regions At are set equal to or less than the respective maximum opening lengths (opening lengths L1a to be described later: refer to FIG. 25) of the respective opening lengths along the rotating direction of concave portions 40b formed in the servo pattern regions Asb. Further, the opening lengths L6 along the rotating direction of the projecting end surfaces of the concave portions 40b formed in the preamble pattern regions Ap are set, as an example, equal to the respective opening lengths (the opening lengths L1 to be described later: refer to FIG. 25) along the rotating direction of the concave portions 40b formed in the address pattern regions Aab at the respective same radius positions.

Figure 25:
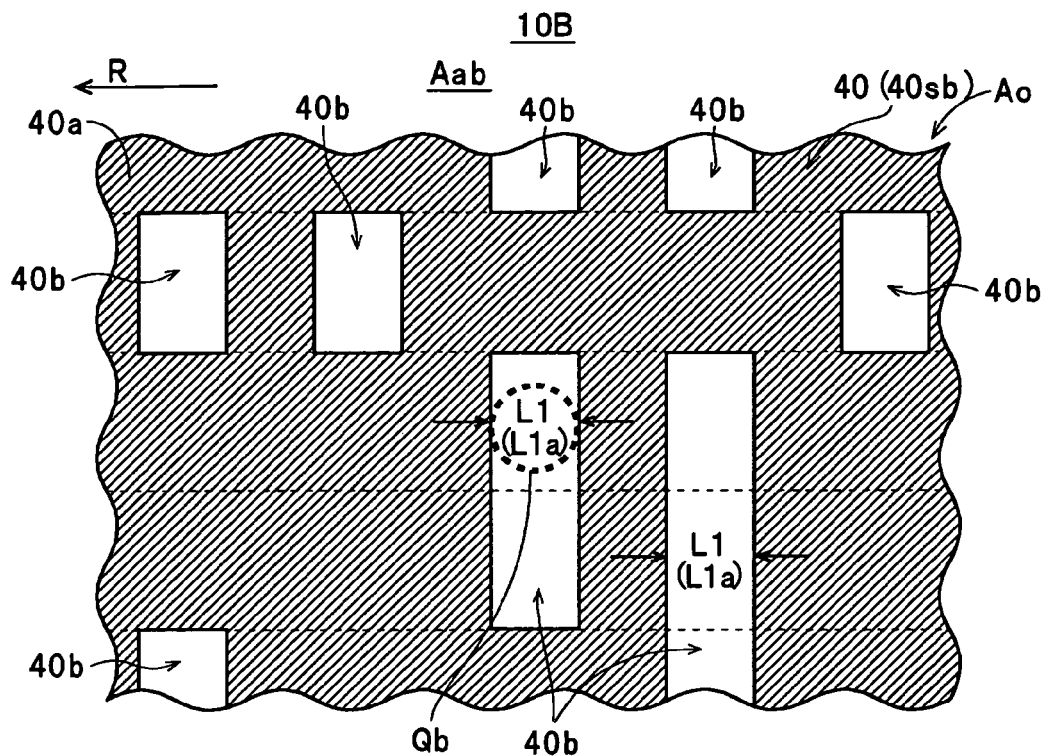
FIG. 25 is a plan view of still another magnetic disk showing an example of an address pattern formed in an address pattern region of a servo pattern region in an outer peripheral region.

As shown in FIG. 25, in the servo pattern 40sb (address pattern) formed in the address pattern regions Aab, the respective lengths along the rotating direction of the projecting end surfaces of the convex portions 40a and the respective opening lengths along the rotating direction of concave portions 40b are set in correspondence to address data. In this case, in the magnetic disk 10B, the address data is encoded so as to invert, as an example, a high level and a low level of RZ (Return-to-Zero) code (different from ordinary RZ code, in "0", an overall bit period is set to a high level, and in "1", the front half of the bit period is changed to a low level and the rear half thereof is changed to a high level) and recorded in the address pattern regions Aab. Specifically, since the convex portions 40a are formed in correspondence to a high level of the code and the concave portions 40b are formed in correspondence to a low level thereof, a concave/convex pattern that corresponds to the data content of the address data is formed in the address pattern regions Aab. Therefore, in the magnetic disk 10B, the respective opening lengths (signal lengths recognized as a low level in a hard disk drive 1) along the rotating direction of the concave portions 40b constituting the address pattern (servo pattern 40sa) are composed of only one type of lengths L1 that are equal to each other (an example of "second lengths" in the present invention, also referred to as "A lengths"). In this case, in the magnetic disk 10B, a reference length and a reference opening length along the rotating direction are longer in an outer peripheral region Ao than in an inner peripheral region Ai likewise the magnetic disk 10A described above. Accordingly, in the magnetic disk 10B, the respective opening lengths L1 of the concave portions 40b in the address pattern regions Aab of the outer peripheral region Ao are equivalent to the "maximum lengths of the second lengths" of the present invention. In the following description, when the maximum lengths of the respective opening lengths L1 are discriminated from the other opening lengths L1, it is also referred to as the "opening lengths L1a".

In the magnetic disk 10B, as shown in FIG. 24, the opening lengths L6 along the rotating direction of the concave portions 40b arranged along the rotating direction in first burst regions Ab1 to fourth burst regions Ab4 in the burst pattern regions Aba are set equal to the respective opening lengths L1 along the rotating direction of the concave portions 40b formed in the address pattern regions Aab at the respective same radius positions and to the opening lengths L6 along the rotating direction of the concave portions 40b formed in the preamble pattern regions Ap at the respective same radius positions. Further, the lengths L5 along the rotating direction of the convex portions 40a between the concave portions 40b formed in the burst pattern regions Aba are set, for example, equal to the respective lengths L5 along the rotating direction of the convex portions 40a formed in the preamble pattern regions Ap at the respective same radius positions. In the burst pattern regions Aba, non-servo signal regions Axb are formed between the first burst regions Ab1 and the second burst regions Ab2, between the second burst regions Ab2 and the third burst regions Ab3, and between the third burst regions Ab3 and the fourth burst regions Ab4, respectively likewise the magnetic disk 10A described above, thereby a dummy pattern is formed to forcibly and smoothly insert the convex portions 39a of a stamper 30 into a resin layer 18 when the magnetic recording medium is manufactured. Further, as shown in FIG. 24, non-servo signal regions Ax are formed between the data recording regions At and the preamble pattern regions Ap, between the preamble pattern regions Ap and the address pattern regions Aab, between the address pattern regions Aab and the burst pattern regions Aba, and between the burst pattern regions Aba and the data recording regions At, respectively likewise the magnetic disk 10A described above.

As described above, in the magnetic disk 10B, the opening lengths L4 along the radius direction of the concave portions 40b formed in the data recording regions At are set equal to or less than the respective maximum opening lengths of the respective opening lengths L1 along the rotating direction of the concave portions 40b formed in the servo pattern regions Asb (in the example, respective opening lengths L1a along the rotating direction of the concave portions 40b of the address pattern regions Aab of the outer peripheral regions Ao). Accordingly, when circular regions Qb whose diameters are equal to the maximum lengths L1a in the address pattern regions Aab (refer to FIG. 25) are disposed to any portion in the data recording regions At, at least a portion of the convex portions 40a is included in the circular regions Qb. It should be noted that when the circular regions Qb disposed in the preamble pattern regions Ap are in coincidence with the inscribed circles of the opening surfaces of the concave portions 40b, the boundary portions between the convex portions 40a and the concave portions 40b are included in the circular regions Qb. In this case, the state in which the boundary portions between the convex portions 40a and the concave portions 40b are included is referred to as a "state in which a part of the convex portions 40a is included" in the specification, as described above.

Further, in the magnetic disk 10B, the address pattern is formed in the address pattern regions Aab by encoding the address data such that a high level and a low level of RZ code are inverted, as described above. Accordingly, even if a large number of "1"s continuously exist in the address data, the concave portions 40b are not continuously formed along the rotating direction, and the concave/convex pattern 40 (address pattern) is composed of the concave portions 40b having the opening lengths L1 and the convex portions 40a. As a result, the opening lengths along the rotating direction of the concave portions 40b formed in the address pattern regions Aab are set to the opening lengths L1 that are equal to each other in the respective same radius positions. Accordingly, when circular regions Qa whose diameters are equal to the maximum opening lengths L1 (in the example, the opening lengths L1a of the concave portions 40b in the outer peripheral region Ao) are disposed to any portion in the address pattern regions Aab, at least a portion of the convex portions 40a is included in the circular regions Qa. It should be noted that, in a state in which the circular regions Qa disposed in the address pattern regions Aab are in coincidence with the inscribed circles of the opening surfaces of the concave portions 40b, the boundary portions between the convex portions 40a and the concave portions 40b are included in the circular regions Qa. Further, in the magnetic disk 10B, the opening lengths L6 of along the rotating direction of the concave portions 40b formed in the first burst regions Ab1 to the fourth burst regions Ab4 in the burst pattern regions Aba are set equal to the respective opening lengths L1 along the rotating direction of the concave portions 40b formed in the servo pattern regions Asb at the respective same radius positions, as described above. Accordingly, when the circular regions Qa whose diameters are equal to the maximum lengths L1a in the address pattern regions Aab (refer to FIG. 25) are disposed to any portion of the first burst regions Ab1 to the fourth burst regions Ab4 of the burst pattern regions Aba, at least a portion of the convex portions 40a is included in the circular regions Qa. It should be noted that when the circular regions Qb disposed in the burst pattern regions Aba are in coincidence with the inscribed circles of the opening surfaces of the concave portions 40b, the boundary portions between the convex portions 40a the concave portions 40b are included in the circular regions Qb.

Further, in the magnetic disk 10B, the concave/convex pattern 40 of the same type as the servo pattern 40sb formed in the preamble pattern regions Ap and the burst pattern regions Aba (the first burst regions Ab1 to the fourth burst regions Ab4) is formed in non-servo signal regions Ax, Axb. Accordingly, even if the circular regions Qb are disposed at any position in the preamble pattern regions Ap and the burst pattern regions Aba (the first burst regions Ab1 to the fourth burst regions Ab4) in the magnetic disk 10B in which at least a portion of the convex portions 40a is included in the circular regions Qb, when the circular regions Qb are disposed in any portion of the non-servo signal regions Ax, Axb in which the servo pattern 40sb of the same type as these regions is formed, at least a portion of the convex portions 40a is included in the circular regions Qb.

As described above, in the magnetic disk 10B, the data track pattern 40t and the servo pattern 40sb are arranged by forming the convex portions 40a such that at least a part of the convex portions 40a is included in the arbitrarily disposed circular regions Qb in the entire areas of the data recording regions At, and the servo pattern regions Asb. In other words, in the entire areas of the data recording regions At and the servo pattern regions Asb of the magnetic disk 10B, the opening lengths in any direction of the opening surfaces of the concave portions 40b (in the example, any of the opening lengths along the rotating direction of the concave portions

40b and the opening lengths along the radius direction thereof) are shorter than (or equal to) the diameters of the circular regions Qb (in the example, the opening lengths L1a). That is, in the magnetic disk 10B, the data track pattern 40t and the servo pattern 40sb are formed such that the convex portions 40a whose opening surfaces are excessively wide do not exist in any region of the data recording regions At and the servo pattern regions Asb, unlike in the conventional magnetic disk 10z.

When the magnetic disk 10B is manufactured, the intermediate body 20 shown in FIG. 10 and the stamper 30 shown in FIG. 11 are used likewise the manufacture of the magnetic disk 10A described above. In this case, the stamper 30 for manufacturing the magnetic disk 10B is another example of the stamper for manufacturing the magnetic recording medium according to the present invention, has a concave/convex pattern 39 formed thereon to form a concave/convex pattern 41 for forming the concave/convex pattern 40 of the magnetic disk 10B (the data track pattern 40t and the servo pattern 40sb), and can manufacture the magnetic disk 10B by the imprint method. In this case, the concave/convex pattern 39 of the stamper 30 is formed such that convex portions 39a correspond to the concave portions 40b of the concave/convex pattern 40 of the magnetic disk 10B and concave portions 39b correspond to the convex portions 40a of the concave/convex pattern 40 thereof. Accordingly, in the concave/convex pattern 39 of the stamper 30, the convex portions 39a and the concave portions 39b are formed such that no convex portions 39a whose projecting end surfaces are excessively wide exist. As a result, when the magnetic disk 10B is manufactured using the stamper 30, the convex portions 39a of the stamper 30 are forcibly inserted into the resin layer 18 of the intermediate body 20 smoothly at the time the intermediate body 20 is subjected to the imprint processing likewise the manufacture of the magnetic disk 10A described above. Thus, the convex portions 39a can be forcibly inserted into the resin layer 18 sufficiently deeply without forming a thick residual between the extreme ends of the convex portions 39a of the stamper 30 and the mask layer 17 of the intermediate body 20. Therefore, the concave portions 41b having a desired extent can be formed on the resin layer 18 without the excessive expansion of the concave portions 41b when a remaining residual is eliminated. It should be noted that since a method of manufacturing the magnetic disk 10B is the same as the method of the magnetic disk 10A described above, the detailed description thereof is omitted.

In the hard disk drive 1 on which the magnetic disk 10B is mounted, when data is recorded to and reproduced from the magnetic disk 10B likewise the hard disk drive 1 on which the magnetic disk 10A described above is mounted, the data corresponding to the concave/convex patterns 40 formed to the non-servo signal regions Ax and to the non-servo signal regions Axb is determined different from tracking servo data by a control section 6. Specifically, the control section 6 places a magnetic head 3 on a desired track by driving an actuator 3b by controlling a driver 5 based on the data, which corresponds to the concave/convex pattern 40 formed to the preamble pattern regions Ap, the address pattern regions Aab, and the burst pattern regions Aba (except the non-servo signal regions Axb) of the data including the servo data output from a detection section 4.

Further, in the hard disk drive 1, when the address data is extracted based on the data output from the detection section 4 in correspondence to the concave/convex pattern 40 formed to the address pattern regions Aab, the control section 6 decodes the output data from the detection section 4 assuming that it is encoded such that a high level and a low level from RZ code are inverted. As a result, a tracking servo control is executed based on the address data read out from the address pattern regions Aab, the burst signal read out from the burst pattern regions Aba, and the like, thereby the magnetic head 3 can be placed on a desired data recorded track (convex portions 40a). With this operation, data can be recorded and reproduced through the magnetic head 3 placed on the convex portions 40a (data recording tracks) in the data recording regions At.

As described above, according to the magnetic disk 10B and the hard disk drive 1, the convex portions 40a are formed in the address pattern regions Aab such that the respective opening lengths L1 along the rotating direction of the concave portions 40b are set to opening lengths (second lengths) that are equal to each other in the respective same radius regions. Accordingly, there exist no concave portions 40b whose opening lengths are excessively long along the rotating direction (concave portions 40b whose opening lengths are long in all the directions) in the address pattern regions Aab in which the opening lengths along a radius direction of the concave portions 40b tend to increase. Accordingly, when the imprint processing is executed to form the concave/convex pattern 40 in the address pattern regions Aab (in the example, when the concave/convex pattern 39 of the stamper 30 is transferred onto the resin layer 18 of the intermediate body 20), the convex portions 39a of the stamper 30 can be forcibly inserted into the resin layer 18 smoothly without using a stamper having convex portions whose projecting end surfaces are excessively wide. With this arrangement, since a thick residual can be prevented from being formed on the mask layer 17 in the imprint processing, the concave portions 41b can be prevented from being made excessively wide by residual elimination processing. Accordingly, the concave portions 40b formed finally in the portions of the concave portions 41b can be prevented from being made excessively wide. As a result, there can be provided the magnetic disk 10B that can accurately read the address data and the hard disk drive 1 including the magnetic disk 10B.

According to the magnetic disk 10B and the hard disk drive 1, the convex portions 40a are formed in the servo pattern regions Asb such that at least a part of the convex portions 40a is included in the circular regions Qb when the circular regions Qb whose diameters are equal to the maximum lengths L1a of the respective lengths L1 (the second lengths) are disposed in any portions of the servo pattern regions Asb. Accordingly, there exist no convex portions 40b whose opening lengths are excessively long (whose opening surfaces are excessively wide) in all the areas of not only the address pattern regions Aab but also the servo pattern regions Asb. As a result, when the imprint processing is executed to form the concave/convex pattern 40 in the servo pattern regions Asb, the convex portions 39a of the stamper 30 can be forcibly inserted into the resin layer 18 smoothly without using a stamper having convex portions whose projecting end surfaces are excessively wide. With this arrangement, since a thick residual can be prevented from being formed on the mask layer 17 in the imprint processing, the concave portions 41b can be prevented from being made excessively wide by residual elimination processing. Accordingly, the concave portions 40b formed finally in the portions of the concave portions 41b can be prevented from being made excessively wide. Thus, there can be provided the magnetic disk 10B that can accurately read tracking servo control data and the hard disk drive 1 including the magnetic disk 10B.

Further, according to the magnetic disk 10B and the hard disk drive 1, the respective data recording tracks (convex portions 40a) are formed such that the opening lengths L4 along a radius direction of the substrate of the concave portions 40*b* (inter-track concave portions) between the adjacent data recording tracks (convex portions 40*a*) are equal to or less than the maximum opening lengths L1*a* of the respective opening lengths L1 (second lengths). Accordingly, there exist no concave portions 40*b* whose opening lengths along a radius direction are excessively long (concave portions 40*b* whose opening lengths are long in all the directions) in the data recording regions At in which the opening lengths along the rotating direction of the concave portions 40*b* (inter-track concave portions) are made long. As a result, when the imprint processing is executed to form the concave/convex pattern 40 in the data recording regions At, the convex portions 39*a* of the stamper 30 can be forcibly inserted into the resin layer 18 smoothly without using a stamper having convex portions whose projecting end surfaces are excessively wide. With this arrangement, since a thick residual can be prevented from being formed in the imprint processing, the concave portions 41*b* can be prevented from being made excessively wide by the residual elimination processing. Accordingly, the concave portions 40*b* formed finally in the portions of the concave portions 41*b* can be prevented from being made excessively wide. As a result, there can be provided the magnetic disk 10B that can stably record and reproduce the address data and the hard disk drive 1 including the magnetic disk 10B.

According to the hard disk drive 1, since it is provided with the magnetic disk 10B and the control section 6 for executing tracking servo control processing based on a predetermined signal read from the servo pattern regions Asb of the magnetic disk 10B, data can be recorded and reproduced through the magnetic head 3 placed on the convex portions 40*a* in the data recording regions At without being affected by the existence of the concave/convex pattern 40 (dummy pattern) formed in the non-servo signal regions Ax.

Further, according to the stamper 30 for manufacturing the magnetic disk 10B, there is formed the concave/convex pattern 39 that has the convex portions 39*a* formed in correspondence to the concave portions 40*b* of the magnetic disk 10B and the concave portions 39*b* formed in correspondence to the convex portions 40*a* of the concave/convex pattern 40 of the magnetic disk 10B. Thus, when the intermediate body 20 is subjected to the imprint processing, there exist no convex portions 39*a* having excessively wide projecting end surfaces (for example, convex portions 39*a* whose direction along the rotating direction and whose direction along a radius direction are excessively long) on the stamper 30. With this arrangement, the concave/convex pattern 39 (convex portions 39*a*) can be forcibly inserted into the intermediate body 20 smoothly. Accordingly, the occurrence of disadvantage due to an insufficient amount of forcible insertion of the convex portions 39*a* can be prevented in the imprint processing (excessive expansion of the concave portions 41*b* caused by the residual elimination processing). As a result, the magnetic disk 10B, which can securely read the address data and the like, can be manufactured.

It should be noted that the present invention is by no means limited to the above arrangement. In the magnetic disks 10A and 10B, the burst pattern is formed by arranging, for example, the plurality of concave portions 40*b* along the rotating direction in the burst pattern regions Aba.

Figure 26:
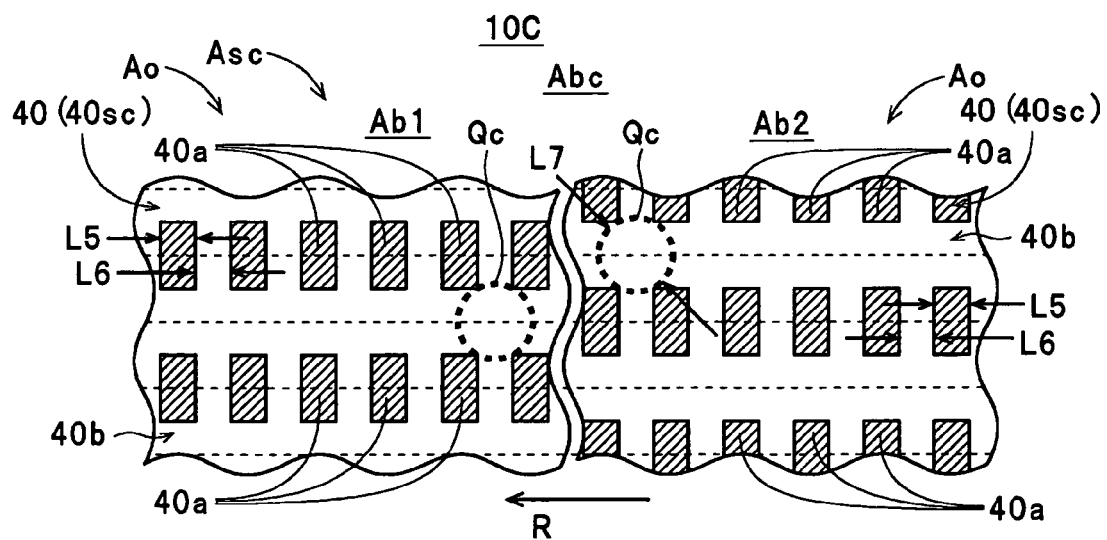
FIG. 26 is a plan view of yet still another magnetic disk showing an example of a burst pattern formed in a burst pattern region.

However, the present invention is by no means limited thereto, and the burst pattern may be formed by arranging a plurality of convex portions 40*a* in burst pattern regions Abc along the rotating direction in place of the concave portions 40*b* of the magnetic disks 10A and 10B as in a magnetic disk 10C shown in FIG. 26. It should be noted that FIG. 26 shows only first burst regions Ab1 and second burst regions Ab2 in the burst pattern regions Abc. In this case, in the magnetic disk 10C, a servo pattern 40*sc* of an address pattern and the like is formed such that the diameters L7 of circular regions Qc that are in contact with the four convex portions 40*a* in the burst pattern regions Abc are equal to or less than the maximum opening lengths of the respective opening lengths along the rotating direction of the concave portions 40*b* formed in address pattern regions. With this arrangement, when circular regions whose diameters are equal to the maximum opening lengths of the respective opening lengths along the rotating direction of the concave portions 40*b* formed in the address pattern regions are disposed in any portions of the servo pattern regions Asc, at least a part of the convex portions 40*a* (including the boundary portions between the convex portions 40*a* and the concave portions 40*b*) is included in the circular regions. As a result, when the intermediate body 20 is subjected to the imprint processing, the convex portions 39*a* of the stamper 30 can be forcibly inserted into the resin layer 18 of the intermediate body 20 smoothly likewise the magnetic disks 10A and 10*b* described above also in the magnetic disk 10C. Thus, the convex portions 39*a* can be forcibly inserted into the resin layer 18 sufficiently deeply without forming a thick residual between the extreme ends of the convex portions 39*a* of the stamper 30 and the mask layer 17 of the intermediate body 20. Therefore, the concave portions 41*b* having a desired extent can be formed on the resin layer 18 without the excessive expansion of the concave portions 41*b* when a remaining residual is eliminated.

Figure 27:
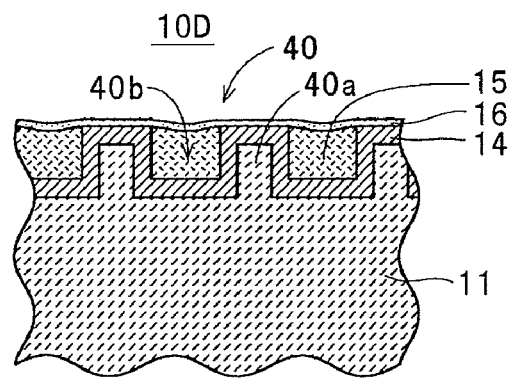
FIG. 27 is a cross-sectional view showing a layer structure of a further magnetic disk.
Figure 28:
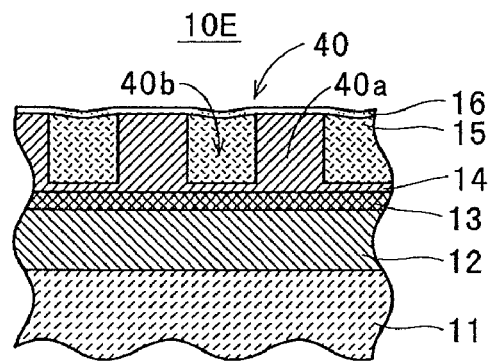
FIG. 28 is a cross-sectional view showing a layer structure of a still further magnetic disk.
Figure 29:
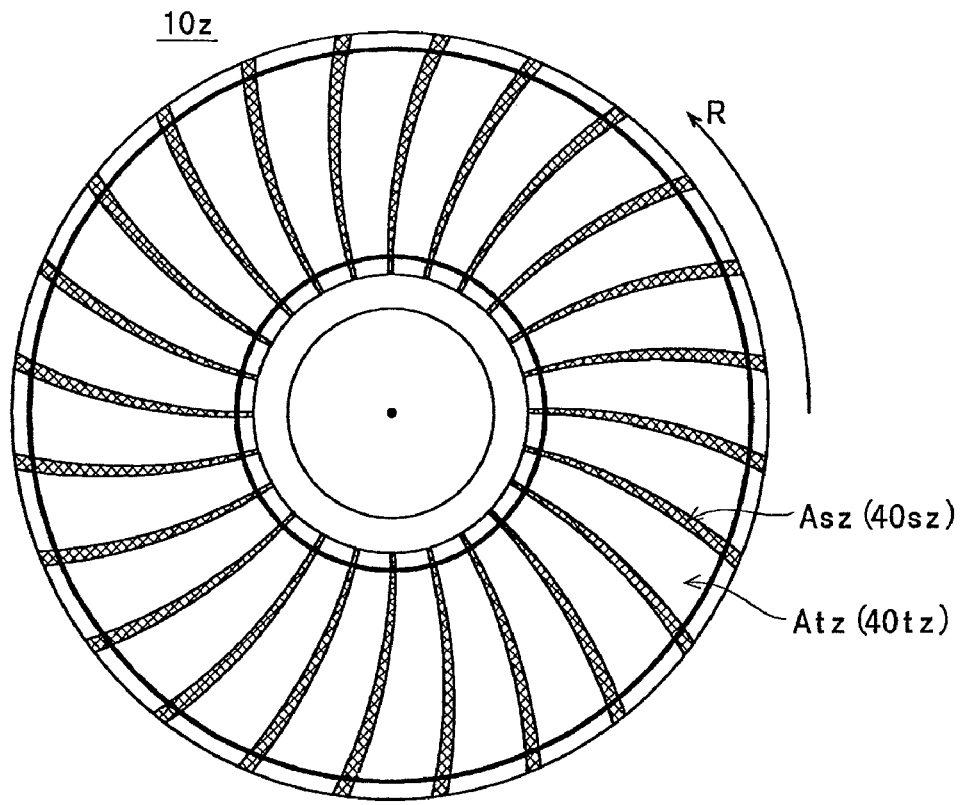
FIG. 29 is a plan view of a conventional magnetic disk.

Further, in the magnetic disks 10A, 10B, and the like, although the convex portions 40*a* of the concave/convex pattern 40 are entirely formed of the magnetic layer 14 (magnetic material) from the projecting ends to the base ends thereof, the convex portions constituting the concave/convex pattern of the present invention are not limited thereto. Specifically, as in, for example, a magnetic disk 10D shown in FIG. 27, when a thin magnetic layer 14 is formed to cover a concave/convex pattern formed on a glass substrate (concave/convex pattern whose concave portions and convex portions have the same positional relation as the concave/convex pattern 40), the concave/convex pattern 40 can be composed of a plurality of convex portions 40*a* whose front surfaces are formed of a magnetic material and a plurality of concave portions 40*b* whose bottom surfaces are formed of the magnetic material. Further, as in a magnetic disk 10E shown in FIG. 28, a concave/convex pattern 40 may be formed by forming not only the bottom surfaces of convex portions 40*a* but also the bottom surfaces of concave portions 40*b* of a magnetic layer 14. In addition, a concave/convex pattern 40 may be composed of, for example, convex portions 40*a* formed in a concave/convex pattern 40, in which only the projecting ends of the convex portions 40*a* are formed of a magnetic layer 14 and the base ends thereof are formed of a non-magnetic material or a soft magnetic material (not shown).

In the magnetic disks 10A, 10B, and the like, although the dummy pattern (concave/convex pattern 40) is formed in the non-servo signal regions Ax and in the non-servo signal regions Axb, the present invention is not limited thereto. For example, non-servo signal regions whose entire areas are composed of convex portions may be formed between the data recording regions At and the preamble pattern regions Ap, between the preamble pattern regions Ap and the address pattern regions Aaa (Aba), between the address pattern regions Aaa (Aab) and the burst pattern regions Aba, and between the burst pattern regions Aba and the data recording regions At as well as non-servo signal regions whose entire areas are composed of convex portions may be also formed between the first burst regions Ab1 and the second burst regions Ab2 of the burst pattern regions Aba, between the second burst regions Ab2 and the third burst regions Ab3 thereof, and between the third burst regions Ab3 and the fourth burst regions Ab4 thereof. According to the magnetic disk arranged, as described above, since concave portions, by which a thick residual may be formed in the imprint processing executed when the magnetic disk is manufactured, do not exist in the non-servo signal regions, the concave portions can be prevented from being excessively wide by residual elimination processing. Accordingly, the magnetic disk, which can securely read servo data, can be provided.

Further, in the magnetic disks 10A, 10B, and the like described above, although the pattern of the same type as the concave/convex pattern 40 in the preamble pattern regions Ap and the burst pattern regions Aba is formed in the non-servo signal regions Ax, Axb as the dummy pattern, the present invention is not limited thereto. For example, a concave/convex pattern 40 having an arbitrary shape, which is different from the concave/convex pattern 40 used for various types of servo signals, may be employed as the dummy pattern. The magnetic recording medium according to the present invention includes a magnetic recording medium, in which no non-servo signal region Ax exists, and the preamble pattern regions, the address pattern regions, and the burst pattern regions are continuously formed in contact with each other in the rotating direction, and a magnetic recording medium in which no non-servo signal region Axb exists, and the burst regions are continuously formed in contact with each other in the rotating direction. In the magnetic disks 10A, 10B, and the like, although the servo pattern 40sa (40sb) and the data track pattern 40t are formed only on the one surface side of the glass substrate 11, the present invention is not limited thereto. That is, the servo pattern 40sa (40sb) and the data track pattern 40t may be formed on both the front and back surfaces of the glass substrate 11. Further, the magnetic recording medium of the present invention is not limited to the perpendicular recording type magnetic recording medium as the magnetic disks 10A and 10B, and the present invention may be also applied to a longitudinal recording type magnetic recording medium.

What is claimed is:

1. A magnetic recording medium comprising:
    a servo pattern region formed on at least one surface side of a substrate, the servo pattern region having a servo pattern formed of a concave/convex pattern having a plurality of convex portions and concave portions, at least projecting end portions of the convex portions are formed of a magnetic material; and
    a data recording region formed on the one surface side of the substrate, the data recording region having a data track pattern on which a concentric or spiral data recording track is formed,
    wherein the convex portions are formed in an address pattern region of the servo pattern region such that maximum opening lengths, which are located in the respective same radius regions each having the same distance from the center of the data track pattern, of the respective opening lengths along the rotating direction of the substrate of the concave portions constituting the concave/convex pattern for an address pattern are set to first lengths that are double minimum opening lengths along the rotating direction of the respective concave portions in the respective same radius regions.

2. A magnetic recording medium according to claim 1, wherein the convex portions constituting the concave/convex pattern are formed in the servo pattern region such that when a circular region whose diameter is equal to the maximum length of the respective first lengths is disposed in any portions of the servo pattern region, at least a part of the convex portions is included in the circular region.

3. A magnetic recording medium according to claim 1, wherein:
    a plurality of the data recording tracks are formed of convex portions, at least projecting end portions of which are formed of the magnetic material; and
    the respective data recording tracks are formed such that the opening lengths along a radius direction of the substrate of the concave portions between the adjacent data recording tracks are set equal to or less than the maximum length of the respective first lengths.

4. A recording/reproducing apparatus comprising:
    the magnetic recording medium according to claim 1; and
    a control section for executing tracking servo control processing based on a predetermined signal read from the servo pattern region of the magnetic recording medium.

5. A stamper for manufacturing a magnetic recording medium comprising a concave/convex pattern formed thereon, the concave/convex pattern having convex portions formed in correspondence to the concave portions of the concave/convex pattern of the magnetic recording medium according to claim 1 and concave portions formed in correspondence to the convex portions of the concave/convex pattern of the magnetic recording medium.

6. A magnetic recording medium comprising:
    a servo pattern region formed on at least one surface side of a substrate, the servo pattern region having a servo pattern formed of a concave/convex pattern having a plurality of convex portions and concave portions, at least projecting end portions of the convex portions are formed of a magnetic material; and
    a data recording region formed on the one surface side of the substrate, the data recording region having a data track pattern on which a concentric or spiral data recording track is formed,
    wherein the convex portions are formed in an address pattern region of the servo pattern region such that the respective opening lengths along the rotating direction of the substrate of the concave portions constituting the concave/convex pattern for an address pattern are set to A lengths that are equal to each other in the respective same radius regions each having the same distance from the center of the data track pattern.

7. A magnetic recording medium according to claim 6, wherein the convex portions constituting the concave/convex pattern are formed in the servo pattern region such that when a circular region whose diameter is equal to the maximum length of the respective A lengths is disposed in any portions in the servo pattern region, at least a part of the convex portions is included in the circular region.

8. A magnetic recording medium according to claim 6, wherein:
    a plurality of the data recording tracks are formed of convex portions, at least the projecting end portions of which are formed of the magnetic material; and
    the respective data recording tracks are formed such that the opening lengths along a radius direction of the substrate of the concave portions between the adjacent data recording tracks are set equal to or less than the maximum length of the respective A lengths.

9. A recording/reproducing apparatus comprising:
    the magnetic recording medium according to claim 6; and
    a control section for executing tracking servo control processing based on a predetermined signal read from the servo pattern region of the magnetic recording medium.

10. A stamper for manufacturing a magnetic recording medium comprising a concave/convex pattern formed thereon, the concave/convex pattern having convex portions formed in correspondence to the concave portions of the concave/convex pattern of the magnetic recording medium according to claim 6 and concave portions formed in correspondence to the convex portions of the concave/convex pattern of the magnetic recording medium.

* * * * *